United States Patent [19]
Loopstra et al.

[11] Patent Number: 6,020,964
[45] Date of Patent: Feb. 1, 2000

[54] INTERFEROMETER SYSTEM AND LITHOGRAPH APPARATUS INCLUDING AN INTERFEROMETER SYSTEM

[75] Inventors: Erik R. Loopstra, Heeze; Alexander Straaijer, Eindhoven, both of Netherlands

[73] Assignee: ASM Lithography B.V., LA Veldhoven, Netherlands

[21] Appl. No.: 09/114,747

[22] Filed: Jul. 13, 1998

[30] Foreign Application Priority Data

Dec. 2, 1997 [EP] European Pat. Off. ............. 97203771

[51] Int. Cl.[7] ...................................................... G01B 9/02
[52] U.S. Cl. .......................... 356/358; 356/363; 356/401
[58] Field of Search .................................... 356/363, 356, 356/401

[56] References Cited

U.S. PATENT DOCUMENTS 4,976,019  12/1990  Kitamura ............................... 356/358

FOREIGN PATENT DOCUMENTS 0498499  8/1992  European Pat. Off. .
4-179115  6/1992  Japan .

*Primary Examiner*—Robert H. Kim
*Attorney, Agent, or Firm*—IP Group of Pillsbury Madison & Sutro LLP

[57] ABSTRACT

A composite interferometer system has a plurality of X and/or Y measuring axes which co-operate with an X and/or Y measuring mirror arranged on an object. The interferometer system also has at least one Z measuring axis, which extends partly in an XY plane and co-operates with Z measuring mirrors arranged on the object and Z reflectors. Thus, a larger number of more accurate and reliable measurements can be performed with the interferometer system.

40 Claims, 15 Drawing Sheets

6,020,964

INTERFEROMETER SYSTEM AND LITHOGRAPH APPARATUS INCLUDING AN INTERFEROMETER SYSTEM

BACKGROUND OF THE INVENTION

1. Field of the Invention

The invention relates to an interferometer system for measuring the position and displacement of an object in a plane which is parallel to the XY plane of an XYZ system of co-ordinates, by X and Y measuring mirrors which are arranged on a holder for the object. The system is being provided with or a generator which generates a plurality of measuring beams and for directing or directs the measuring beams along a plurality of measuring axes which are parallel to the XY plane and extend to and from the measuring mirrors, and radiation-sensitive detectors for converting measuring beams reflected by the measuring mirrors into electric measuring signals. The number of X and Y measuring axes are at least equal to the number of object movements to be measured interferometrically.

The invention also relates to a lithographic projection apparatus which includes such an interferometer system. This apparatus may be a stepper or a step-and-scanner.

A measuring axis of the interferometer system is an axis along which the position of the displacement in a given direction (X or Y) of a given point of the object is measured. This measuring axis does not need to coincide with the chief ray of the measuring beam which is used for this measurement. If the measuring beam is sent through the system twice and reflected twice at substantially the same point by the object, the measuring axis is situated between the chief ray of the measuring beam on the first passage and the chief ray of this beam on the second passage.

2. Description of the Related Art

EP-A 0 498 499 describes an embodiment of an interferometer system, and an optical lithographic projection apparatus including such an interferometer system, for repetitively reduced imaging of a mask pattern, for example, the pattern of an integrated circuit (IC) on a substrate provided with a radiation-sensitive layer. Between two successive images of the mask pattern on the same substrate, the substrate and the mask are moved with respect to each other, for example, parallel to the X or Y direction of an XYZ system of co-ordinates, while the substrate plane and the mask plane are parallel to the XY plane.

The projection apparatus is used in combination with masking and diffusion techniques for manufacturing integrated circuits. In this method, a first mask pattern is imaged in a large number, for example, one hundred IC areas of the substrate. The substrate is then removed from the projection apparatus to subject it to the desired physical and/or chemical process steps. Subsequently, the substrate is arranged in the same or another; similar, projection apparatus to form an image of a second mask pattern in the different IC areas of the substrate, and sc forth. It should then be ensured that the images of the mask patterns are positioned very accurately with respect to the substrate fields.

To this end, the projection apparatus which are currently used comprise:

an interferometer system for the substrate table with which the movements of this table, and hence those of the substrate holder and the substrate, can be followed accurately and the position of the substrate can be determined accurately;

an alignment system with which the mask can be aligned with respect to the substrate, which alignment system closely co-operates with the interferometer system;

a focus error detection system with which it can be ensured that the images of the mask pattern formed in IC areas of the substrate are always sharp, and a tilt detection system for detecting the tilt of the substrate and the image of the mask pattern with respect to each other, which detection system may be combined with the focus error detection system and is then also referred to as focus-and-level detection system.

The known composite interferometer system may have three measuring axes with which the movements of the substrate in the X direction and the Y direction and the rotation $\phi_z$ of the substrate about the Z axis, being the optical axis of the projection system, can be measured. The special feature of the interferometer system in accordance with EP-A 0 498 499 is that it has five measuring axes and that not only the displacement of the substrate along the X axis and the Y axis and the rotation about the Z axis can be measured very accurately, but also the tilt $\phi_x$ about the X axis and the tilt $\phi_y$ about the Y axis. When this interferometer system is used, each field of the substrate can be positioned very accurately with respect to the mask pattern without a separate alignment per field being necessary. Consequently, the time required for illuminating a substrate can be reduced considerably.

In the optical lithographic projection apparatus, hereinafter also referred to as photolithographic apparatus, the image field of the projection system must coincide with the substrate surface, i.e., there should be a given relation between the Z positions of the image plane and those of the surface of the substrate holder. In the currently used photolithographic apparatus, in which the substrate table is always positioned underneath the projection lens system and is moved across distances which, at a maximum, on the order of the substrate size, this relation is controlled by means of said focus-and-level detection system whose elements are arranged in a measuring frame in the form of a plate which is rigidly connected to the projection system. With the aid of the above-mentioned detection systems and the servosystems of which they form part, the substrate and the mask pattern can then not only be positioned globally with respect to each other, but also sufficiently accurately per field. In a novel generation of photolithographic projection apparatus currently being developed, with the aid of which ICs having a larger number of components must be manufactured, i.e., with which even smaller details must be imaged in the substrate fields and in which the substrate table is moved across distances which are larger than the substrate size, new problems present themselves. On one hand, there is the problem of the necessity of an even more accurate alignment, and, on the other hand, there is the problem that the relation can no longer be controlled in the manner described. Consequently, there is a need for another mode of measuring the distance, in the Z direction, between the projection system and the substrate holder which is also referred to as chuck.

SUMMARY OF THE INVENTION

It is an object of the invention to provide an interferometer system with which the desired measurement can be performed and allows very accurate and reliable measurements of displacements of the substrate in a photolithographic apparatus, inter alia, for the purpose of aligning a substrate and a mask pattern with respect to each other. This interferometer system is characterized in that it is also adapted to measure a Z position of the object by a Z measuring mirror which is arranged on the holder of the object at an acute angle to the XY plane, to which end the interferometer system has a Z measuring axis and is provided with or a generator which generates a Z measuring beam and for directing or directs the measuring beam onto the Z measuring mirror, and a Z detector for converting the Z measuring beam from the Z measuring mirror into a signal which comprises information about the Z position of the object.

The invention is based on the recognition that, for accurate and reliable interferometer measurements in the X and Y directions, displacements of the substrate in the Z direction must be taken into account and compensated for, and that the Z displacements can be measured in a simple manner by extending the known interferometer system so that it supplies a Z measuring beam, which is parallel to the XY plane, from the radiation source to the Z measuring mirror, and is reflected by the Z measuring mirror to a reflecting reference element with respect to which, the Z position of the substrate is measured.

By making use of the Z measuring mirror, the desired Z position measurement is transformed into an X or Y position measurement which can be performed with an extensive XY interferometer system. Then, it is no longer necessary to arrange a separate optical tilt detection system underneath the projection lens system for the Z position measurement and the tilt position measurement of the substrate. The Z position and the tilt position could also be measured by, for example, capacitive or inductive sensors. Then, however, the entire two-dimensional surface area of the object, whose position must be measured, should comply with planeness requirements which are not realizable or hardly realizable in practice. When an interferometer system with a Z measuring axis is used, the Z measuring mirror only needs to have length in one direction on the order of the distance across which the object holder moves in that direction, while in the perpendicular direction, the measuring mirror only needs to have a width of the order of the Z measuring beam cross-section at the location of the measuring mirror. Thus, it is sufficient to use a strip-shaped mirror so that the planeness requirements can easily be fulfilled.

It is to be noted that a composite interferometer system for determining the X, Y and Z positions of a substrate table is described in the English-language abstract of Japanese patent application 4-179115. The measuring mirrors are arranged on the sides of the substrate table, instead of on the substrate holder, which is part of the substrate table. These measuring mirrors are formed by four elements, which each having a reflecting side face and lower face. The lower faces are used to measure the Z position and the side faces being used to measure the X and Y positions. This system comprises four conventional Michelson interferometers; one, used for measuring the X position only, a second, for measuring the Y position only, and the other two, are used for measuring the Z position only. The Z interferometers are arranged under the substrate table extra space. In this system, the Z position of the substrate table is measured with respect to the Z interferometers, instead of the Z position of the substrate holder with respect to a Z reflector which is arranged on an object with respect to which, the Z position of the substrate holder must be measured.

The interferometer system according to the invention is applicable if the measurement of the positions of a substrate takes place at a considerably different instant than the illumination of the substrate via the mask pattern. Notably in that case, a reproducible measurement of the Z position is of great importance. The measurement and illumination of a substrate at different instants may be performed in a photolithographic apparatus with a single substrate table, but is notably the appropriate procedure in a photolithographic apparatus which is provided with an illumination station and a separate alignment station, and two substrate tables. During use of this apparatus, all IC areas of a first substrate present on a first substrate holder are illuminated in the illumination station with the mask pattern, while an alignment mark of a second substrate is aligned in the alignment station with respect to an alignment mark provided on a second substrate table. After the first substrate has been illuminated completely, the substrate table is removed from the illumination station, whereafter the first substrate is removed from the substrate table and a third substrate is provided on the first substrate table, and subsequently this substrate is aligned in the alignment station with respect to the first substrate table. Meanwhile, the second substrate table has been moved to the illumination station and the alignment mark of this table has been aligned with respect to a mask mark so that also the substrate mark is aligned with respect to the mask mark so that the second substrate can be illuminated during alignment of the third substrate with respect to the first substrate table. The greater part of the alignment procedure thus takes place outside the illumination station and the period of time during which this station is suitable for the actual illumination or projection is maximal, and the number of substrates per unit of time which can be illuminated by the apparatus is maximal, which is an important aspect in the photolithographic manufacturing technique for ICs.

A preferred embodiment of the interferometer system according to the invention is further characterized in that the Z measuring mirror is arranged on the holder of the object at an angle of substantially 45° to the XY plane.

If the reference mirror is parallel to the XY plane, the Z measuring mirror may then have a minimal width because the Z measuring beam traverses the same path to and from the Z reflector.

An embodiment of the interferometer system according to the invention may be further characterized in that the Z measuring mirror is constituted by a beveled portion of an X or Y measuring mirror.

Viewed in the Z direction, an object holder side face suitable for this purpose is divided into a straight portion and an oblique portion at an angle of preferably 45° to the straight portion, and both parts are implemented as mirrors.

A preferred embodiment of the interferometer system is, however, characterized in that the Z measuring mirror is constituted by a beveled bar which is provided on a side face of the object holder on which also an X or Y measuring mirror is arranged, said bar extending in the Z direction through only a small portion of said side face and, in the direction perpendicular thereto, throughout the side face.

Since the reference reflector is not arranged against the projection lens holder, a given distance, for example of the order of 70 mm, will exist in a photolithographic apparatus between one end of this reflector and the axis of the projection lens. In order that the measuring beam reflected by the Z measuring mirror can reach the z reflector, also in an extreme X position of the substrate holder, the distance in that position between the axis of the projection lens and the center of the Z measuring mirror must be minimally equal to said distance. This means that the substrate holder would have to be enlarged for the purpose of the Z measurement. Since this holder must have a given height, also because the X or Y measuring mirror must also be provided on the side faces on which the Z measuring mirror must be provided, the increase of the size of the substrate holder for the Z measuring mirror would raise its weight considerably. By providing the Z measuring mirror on a thin bar which is fixedly connected to the substrate holder, the weight of this holder can be reduced considerably.

The Z measuring mirror is preferably arranged on the part of the object holder remote from the object. By placing the Z measuring mirror on the lower side of the holder and the X or Y measuring mirror above it, the risk of the occurrence of Abbe errors can be reduced. Moreover, a maximal portion of the relevant side face of the object holder and a maximal space between the Z measuring mirror and the projection system are available for other measurements.

In the interferometer system, a separate reference mirror may be provided for the reference beam associated with the Z measuring beam. The Z detector which receives the Z measuring beam and the Z reference beam then supplies a signal in which the information about the Z position is mixed with information about the X position, if the Z measuring mirror is arranged on the same side face of the object holder as the X measuring position, or information about the Y position if the Z measuring mirror is arranged on the same side face as the Y measuring mirror. An electronic differentiation with the X position signal or the Y position must then still be performed on this signal, i.e., this signal must be combined with the X position, or Y position, signal to obtain the pure Z position.

However, the interferometer system is preferably further characterized in that the reference mirror for the reference beam associated with the Z measuring beam is constituted by an X or an Y measuring mirror which is arranged on that side face of the object holder on which also the Z measuring mirror is arranged.

An optical differentiation is then performed and the output signal of the Z detector comprises pure Z position information. Then it is not necessary to perform an electronic differentiation. The optical differentiation has the advantage that one is no longer dependent on the processing speed of electronic circuits.

For the Z measuring axis, a beam splitter must combine the measuring beam and the associated reference beam, after they have been reflected by the measuring mirror and the reference mirror, respectively, such that the radiation spots formed by these beams in the plane of the Z detector coincide as satisfactorily as possible. The signal supplied by this detector then has a maximal amplitude. However, these radiation spots may be offset with respect to the detector due to an unwanted tilt of the measuring mirrors associated with these beams, so that the directions of these beams vary. This phenomenon is known as beam walk-off. Since the Z measuring beam is reflected by the Z measuring mirror as well as the Z reference element, the beam walk-off for the Z measuring beam is larger than that for the Z reference beam. If use is made of the above-mentioned optical differentiation method, i.e., if the Z reference beam is sent to an X or Y measuring mirror, the beam walk-off can be reduced. In fact, the beam walk-off then extends in the same direction for both beams. The optical differentiation method thus provides a second advantage.

To further reduce the beam walk-off, the interferometer system is preferably further characterized in that the path of the Z measuring beam incorporates a retroreflector by which the Z measuring beam reflected by the measuring mirror and directed towards the detector is reflected to the measuring mirror for further reflection on this mirror.

Due to this extra reflection of the Z measuring beam on the measuring mirror, the original direction of the measuring beam is maintained, independent of a possible tilt of the mirrors in the path of this beam.

The number of X and Y measuring axes of the interferometer system may be different, dependent on the application of the system. However, this system is preferably further characterized in that, in addition to the Z measuring axis, this system comprises at least five further measuring axes.

In this system, the advantage of a maximal measuring accuracy in the X and Y directions is combined with that of an extra measuring facility, namely the Z measurement.

To render the interferometer measurements independent of variations in the refractive index of the medium in which the measuring beams propagate, the interferometer system may be further characterized in that it has a measuring axis along which two measuring beams of different wavelengths propagate.

Since the same distance is measured with two beams of different wavelengths, and the refractive index of the medium is dependent on the wavelength, a possible refractive index variation can be measured, and the measuring result of the interferometer system can be compensated therefor. The measuring axis may be a separate reference measuring axis, or may be formed by one of the other measuring axes.

The invention also relates to a projection apparatus for repetitively projecting a mask pattern on a substrate, which apparatus comprises an illumination unit for supplying a projection beam, a mask table with a mask holder, a substrate table with a substrate holder, a projection system arranged in the path of the projection beam, and an optical measuring system for measuring positions and orientations of the substrate. This projection apparatus is characterized in that the optical measuring system is an interferometer system as described hereinbefore, in which the object and the object holder are the substrate and the substrate holder, respectively.

The accuracy of this apparatus is improved considerably by using the interferometer system in the projection apparatus, particularly when this apparatus is provided with two substrate tables for the purpose mentioned above.

The projection apparatus is preferably further characterized in that, with the exception of the measuring mirrors, the components of the interferometer system as well as the Z reflector are arranged in a rigid frame in which also the projection system is rigidly secured, which frame is suspended dynamically isolated from the other components of the apparatus.

This measure contributes considerably to the realization of the desired measuring accuracy. The interferometer units are now rigidly coupled free from disturbances to the projection system. Since said frame, also referred to as metrology frame, is suspended in the apparatus in a dynamically isolated manner, or free from vibrations, the positions of the interferometer units present therein are no longer influenced by external forces such as the drive forces for the substrate table and the mask table. The Z reflector is the reflector which is secured to the projection system and reflects the Z measuring beam from the Z measuring mirror to this mirror.

The projection apparatus may be further characterized in that reference mirrors for reference beams associated with X and Y measuring beams are arranged on the holder of the projection system.

The X and Y positions of the substrate are then no longer measured with respect to interferometer elements, but with respect to the projection system. Possible deformations of the metrology frame then have a negligibly small influence on the position measurements.

The projection apparatus may be further provided with an optical measuring system for measuring positions and orientations of the mask and may then be characterized in that the optical measuring system is an interferometer system as described hereinbefore, in which the object and the object holder are the mask and the mask holder, respectively.

In such an apparatus, the mask can also be positioned very accurately.

These and other aspects of the invention are apparent from and will be elucidated with reference to the embodiments described hereinafter.

BRIEF DESCRIPTION OF THE DRAWINGS

In the drawings:

FIG. 12 shows a second part of the interferometer unit, of which FIG. 10 shows the first part;

DESCRIPTION OF THE PREFERRED EMBODIMENTS

Figure 1:
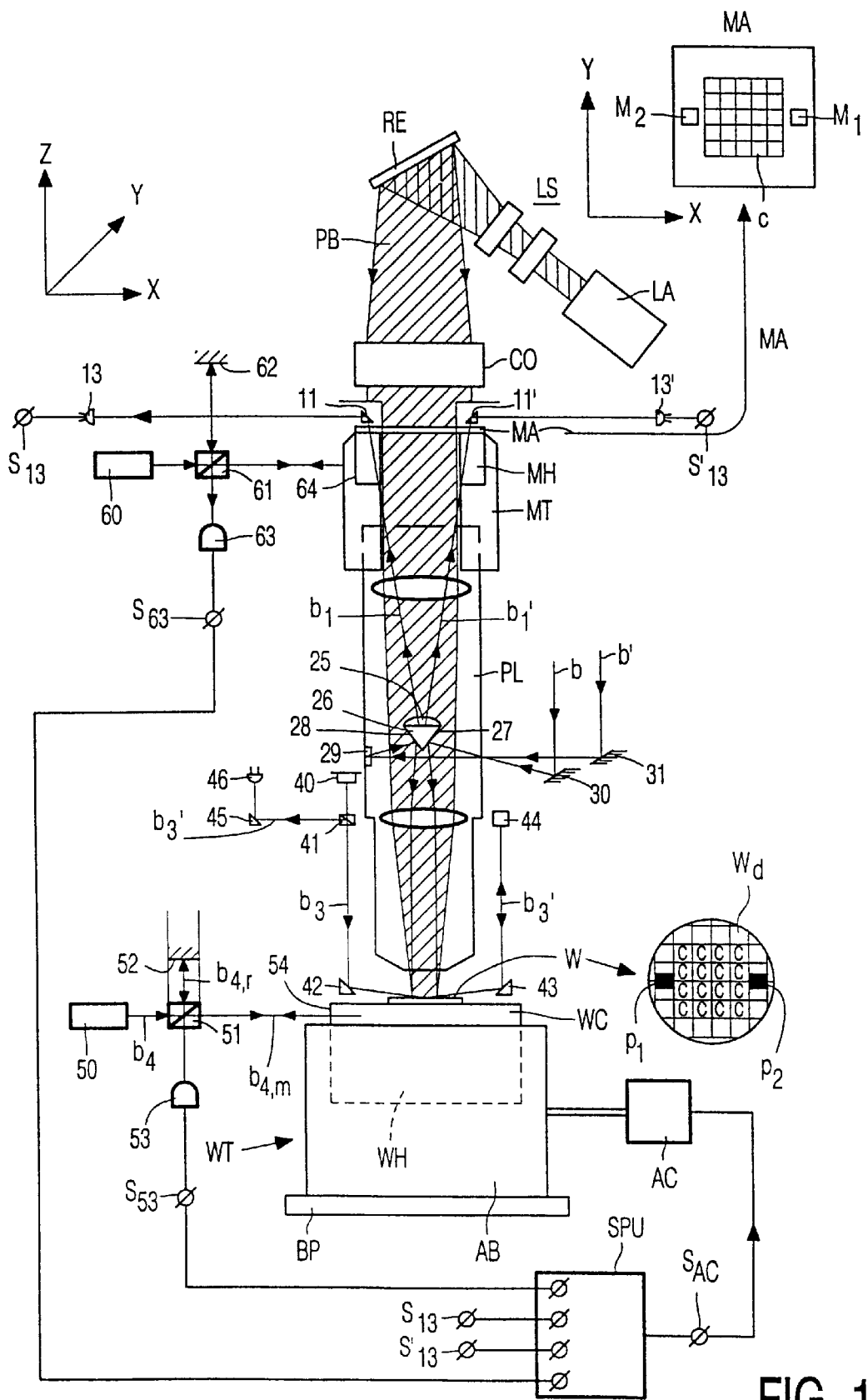
FIG. 1 shows diagrammatically an embodiment of a photolithographic apparatus for repetitively imaging a mask pattern on a substrate.

FIG. 1 shows diagrammatically the optical elements of an embodiment of a photolithographic apparatus for repetitively imaging a mask pattern on a substrate. The main component of this apparatus is a projection column accommodating a projection lens system PL. A mask holder MH for a mask MA, in which the mask pattern C to be imaged is provided, is arranged above this system. The mask holder is present in a mask table MT. A substrate table WT is arranged below the projection lens system PL. This table accommodates a substrate holder WH for a substrate W which is provided with a photosensitive layer and on which the mask pattern must be imaged a number of times, each time in a different IC area Wd. The substrate table is movable in the X and Y directions so that, after imaging of the mask pattern on an IC area, a subsequent IC area can be positioned underneath the mask pattern.

The apparatus further has an illumination system which comprises a radiation source LA, for example, a Krypton-Fluoride Excimer laser or a mercury lamp, a lens system LS a reflector RE and a condensor lens CO. The projection beam PB supplied by the illumination system illuminates the mask pattern C. This pattern is imaged by the projection lens system PL on an IC area of the substrate W. The illumination system may be alternatively implemented as described in EP-A 0 658 810. The projection lens system has a magnification of, for example, M=¼, a numerical aperture NA=0.6 and a diffraction-limited image field having a diameter of 22 mm.

The apparatus further comprises a plurality of measuring systems, namely a system for aligning the mask MA with respect to the substrate W in the XY plane, an interferometer system for determining the X and Y positions and the orientation of the substrate holder and hence of the substrate, and a focus error detection system for determining a deviation between the focal or image plane of the projection lens system PL and the surface of the photosensitive layer on the substrate W. These measuring systems are parts of servo-systems which comprise electronic signal-processing and control circuits and drivers, or actuators, with which the position and orientation of the substrate and the focusing can be corrected with reference to the signals supplied by the measuring systems.

The alignment system uses two alignment marks $M_1$ and $M_2$ in the mask MA, indicated in the top right corner of FIG. 1. These marks preferably consist of diffraction gratings, but they may be alternatively formed by other marks, such as squares or strips which are optically different from their surroundings. The alignment marks are preferably two-dimensional, i.e., they extend in two mutually perpendicular directions, the X and Y directions in FIG. 1. The substrate W has at least two alignment marks, preferably also two-dimensional diffraction gratings, two of which, $P_1$ and $P_2$, are shown in FIG. 1. The marks $P_1$ and $P_2$ are located outside the area of the substrate W where the images of the pattern C must be formed. The grating marks $P_1$ and $P_2$ are preferably phase gratings and the grating marks $M_1$ and $M_2$ are preferably amplitude gratings.

FIG. 1 shows a special embodiment of an alignment system, namely a double alignment system in which two alignment beams b and b' are used for aligning the substrate alignment mark $P_2$ on the mask alignment mark $M_2$, and the substrate alignment mark $P_1$ on the mask alignment mark $M_1$, respectively. The beam b is reflected by a reflecting element 30, for example, a mirror to a reflecting surface 27 of a prism 26. The surface 27 reflects the beam b to the substrate alignment mark $P_2$ which passes a part of the radiation as beam $b_1$ to the associated mask alignment mark $M_2$ where an image of the mark $P_2$ is formed. A reflecting element 11, for example, a prism is arranged above the mark $M_2$, which prism directs the radiation passed by the mark $M_2$ towards a radiation-sensitive detector 13. The second alignment beam b' is reflected by a mirror 31 to a reflector 29 in the projection lens system PL. The reflector 29 passes the beam b' to a second reflecting surface 28 of the prism 26, which surface directs the beam b' onto the substrate alignment mark $P_1$. This mark reflects a part of the radiation of the beam b' as beam $b_1'$ to the mask alignment mark $M_1$ where an image of the mark $P_1$ is formed. The radiation of the beam $b_1$ passing through the mark $M_1$ is directed towards a radiation-sensitive detector 13' by a reflector 11'. The operation of the double alignment system is described in U.S. Pat. No. 4,778,275, to which reference is made for further details of this system.

The embodiment of the alignment system according to FIG. 1 is particularly suitable for an apparatus in which the projection lens system PL is designed for a projection beam PB having a short wavelength, for example, 248 nm, whereas the alignment beam has a considerably longer wavelength, for example, 633 nm. In fact, this system incorporates an extra lens, or correction lens, 25 in the projection column. This lens ensures that the substrate alignment marks are imaged in the plane of the mask alignment marks and with the correct magnification in spite of the fact that the projection lens system is not optimized for the wavelength of the alignment beam. The correction lens is arranged at such a height in the projection column that, on the one hand, the sub-beams of different diffraction orders of the alignment beam, which sub-beams are generated by a substrate alignment mark, are sufficiently separated in the plane of the correction lens so as to be able to influence these sub-beams separately, and, on the other hand, the correction lens has a negligible influence on the projection beam and the image formed therewith of the mask pattern C. The correction lens 25 is preferably arranged in the Fourier plane of the projection lens system. If the correction lens is arranged in a plane in which the chief rays of the alignment beams b and $b_1$ intersect each other, as is shown in FIG. 1, this lens can be used for correcting the two alignment beams. For further details about the object and operation of the correction lens 25, reference is made to U.S. Pat. No. 5,100,237.

A wedge or another deflection element, such as a diffraction element, is preferably arranged in the proximity of an alignment mark in the path of the alignment beam(s). With such a deflection element (not shown in FIG. 1), alignment errors may be prevented, which result from unintentional phase differences within the selected alignment beam portions captured by the detector 13 or 13', which phase differences may occur if the symmetry axis of the alignment beam portions coming from a substrate alignment mark is not perpendicular to the mask plate, so that false reflections may occur within this plate. An alignment system provided with such a deflection element is described in U.S. Pat. No. 5,481,362.

In addition to the global alignment marks $P_1$ and $P_2$ shown in FIG. 1, which marks are used for aligning the total substrate with respect to the mask, referred to as global alignment, the substrate may be provided with further alignment marks, for example, one mark per IC area, to align the relevant area with respect to the mask pattern for each IC area. The mask may have more than two alignment marks, while the further alignment marks may be used, for example, to measure the rotation of the mask about the Z axis so as to correct therefor.

The projection apparatus may further comprise a focus error detection system for determining a deviation between the focal plane of the projection lens system PL and the surface of the substrate W so that this deviation can be corrected, for example, by controlling the height of the substrate surface with Z actuators which are present in the substrate table. The focus error detection system may be constituted by the elements 40, 41, 42, 43, 44, 45 and 46 which are arranged in a holder (not shown) which is fixedly connected to the projection lens system, or are arranged in a metrology frame in which also the projection system is arranged. Element 40 is a radiation source, for example a diode laser emitting a focusing beam $b_3$. This beam is directed at a very small angle onto the substrate by a reflecting prism 42. The beam reflected by this surface is directed towards a retroreflector 44 by the prism 43. The element 44 reflects the beam in itself so that this beam ($b_3'$) once more traverses the same path via reflections on the prism 43, the substrate surface and the prism 42. The beam $b_3'$ reaches the radiation-sensitive detection system 46 via a partially reflecting element 41 and a reflecting element 45. This system comprises, for example, a position-dependent detector or two separate detectors. The position of the radiation spot formed by the beam $b_3'$ on this system is dependent on the extent by which the focal plane of the projection lens system coincides with the surface of the substrate W. Reference is made to U.S. Pat. No. 4,356,392 for an extensive description of the focus error detection system.

For accurately determining the X and Y positions of the substrate table WT, known projection apparatus comprise a multi-axis interferometer system. U.S. Pat. No. 4,251,160 describes a two-axis system and U.S. Pat. No. 4,737,283 describes a three-axis system. In FIG. 1, such an interferometer system is diagrammatically represented by the elements 50, 51, 52 and 53, the Figure showing only one measuring axis, the X axis. The beam $b_4$ emitted by a radiation source 50, for example, a laser, is split into a measuring beam $b_{4,m}$ and a reference beam $b_{4,r}$ by a beam splitter 51. The measuring beam reaches a reflecting side face 54 of the substrate holder WH and the measuring beam reflected by this side face is combined by the beam splitter with the reference beam reflected by a stationary reflector 52, for example, a "corner cube" reflector. The intensity of the combined beam can be measured with a detector 53 and the displacement, in this case in the X direction, of the substrate holder WH can be derived from the output signal of this detector, and also an instantaneous position of this holder can be established.

As is diagrammatically shown in FIG. 1, the interferometer signals, represented by one signal $S_{53}$ for the sake of simplicity, and the signals $S_{13}$ and $S_{13'}$ of the alignment system are applied to a signal-processing unit SPU, for example, a microcomputer, which processes the signals to control signals $S_{AC}$ for an actuator AC with which the substrate holder is moved in the XY plane via the substrate table WT.

With an interferometer system, which not only comprises the X measuring axis shown in FIG. 1, but also a Y measuring axis and possibly a third measuring axis, the positions of, and the mutual distances between, the alignment marks $P_1$, $P_2$ and $M_1$, $M_2$ can be laid down in a system of co-ordinates defined by the stationary interferometer system during the initial, or global, alignment of the mask with respect to the substrate. This interferometer system is also used to enable the substrate table to step very accurately, i.e., to move it through predetermined distances and directions. Such a step is performed to position a subsequent IC field under the mask pattern and the projection lens system after the mask pattern has been imaged with one (or more) flash(es) in a first IC area or field, so that the mask pattern can also be imaged in this field. These step and imaging operations continue until all IC fields have been provided with a mask pattern image. A lithographic apparatus operating in this manner is referred to as stepper.

Due to the demand for more electronic components per surface unit of an IC field, on the one hand, and larger IC fields, on the other hand, increasingly stricter requirements are imposed on the resolving power and the image field of the projection lens system. To alleviate these technologically contradictory requirements, it has already been proposed to use a step-and-scanner. In such an apparatus, the same stepping movements as in a stepper are performed, but every time only a small portion of the mask pattern is imaged on a corresponding sub-field of the IC field when imaging the mask pattern on an IC field. By imaging successive parts of the mask pattern on successive sub-fields of the IC area, an image of the entire mask pattern on an IC field is obtained. To this end, the mask pattern is illuminated with a projection beam which forms a small, for example, rectangular or arcuate, illumination spot at the location of the mask pattern, and the substrate table is moved in a given direction, the scan direction, with respect to the projection lens system and the projection beam, and the mask table is moved in the same or the opposite direction, while the rate of the substrate table is M times that of the mask table. M is the magnification with which the mask pattern is imaged. It should be ensured that the mask and the substrate have the correct mutual position at any moment, which can be realized by means of a very accurate synchronization of the movements of the mask and the substrate, i.e., the rate $V_{sub}$ of the substrate is always equal to M times the rate $V_{MA}$ of the mask.

To check the condition $V_{Sub}=M.V_{MA}$, the step-and-scanner should not only comprise a substrate interferometer system but also a mask interferometer system with which the movement and the position of the mask can be measured accurately. The measuring mirror of the last-mentioned system is preferably secured to the mask holder. The mask interferometer system is denoted in FIG. 1 by the elements 60, 61, 62, 63 and 64 which have the same function as the elements 50, 51, 52, 53, and 54 of the substrate interferometer system. The mask interferometer system signals, represented by one signal $S_{63}$ for the sake of simplicity in FIG. 1, are applied to the signal-processing unit SPU in which these signals are compared with the corresponding signals of the substrate interferometer system. It can then be ascertained whether the mask and the substrate have the mutually correct position and/or move synchronously.

If the measured positions in the X and Y directions of the mask are represented by $X_r$, $Y_r$ and those of the substrate by $X_W$, $Y_W$ and the rotation of the Z axis is represented by $\phi_{z,r}$ and $\phi_{z,w}$, the following conditions will be satisfied if the mask and the substrate are correctly positioned with respect to each other:

$$X_w - MX_r = 0 \tag{1}$$

$$Y_w - MY_r = 0 \tag{2}$$

$$\phi_{z,w} - \phi_{z,r} = 0 \tag{3}$$

in which M is the magnification of the projection lens system. It has been assumed that the mask and the substrate move in opposite directions. If these elements move in the same direction, the minus sign should be replaced by a plus sign in the afore-mentioned conditions.

To ascertain whether these conditions are fulfilled, it is sufficient that both the interferometer system for the substrate and that for the mask have three measuring axes. However, the substrate interferometer system preferably has five measuring axes. As described in EP-A 0 498 499, not only X, Y and $\phi_{z,w}$ but also $\phi_{x,w}$ and $\phi_{y,w}$, i.e., the tilts of the substrate about the X axis and the Y axis can be measured. For the different embodiments of the interferometer units of which a five-axis interferometer system may be composed, reference is made to EP-A 0 498 499. To be able to measure the tilts about the X axis and the Y axis also for the mask, a five-axis mask interferometer system may be used. However, it is alternatively possible to combine a three-axis mask interferometer system with other sensors, such as capacitive sensors, for measuring the tilts of the mask about the X axis and the Y axis.

If $X_w$, $Y_w$, $\phi_{x,w}$, $\phi_{y,w}$ and $X_r$, $Y_r$, $\phi_{x,r}$, $\phi_{y,r}$ are measured and, with the aid of the focus detection system, $Z_w$ and $Z_r$, i.e., the positions along the Z axis of the substrate and the mask, then it can be ascertained whether not only the conditions (1), (2) and (3) but also the conditions:

$$M^2.Z_w - Z_r = 0 \tag{4}$$

$$M.\phi_{x,w} - \phi_{x,r} = 0 \tag{5}$$

$$M.\phi_{y,w} - \phi_{y,r} = 0 \tag{6}$$

are satisfied, in other words whether the mutual distance in the Z direction of the mask and the substrate surface is correct (4) and whether the substrate and the mask are not mutually tilted about the X axis (5) and the Y axis (6).

Figure 2:
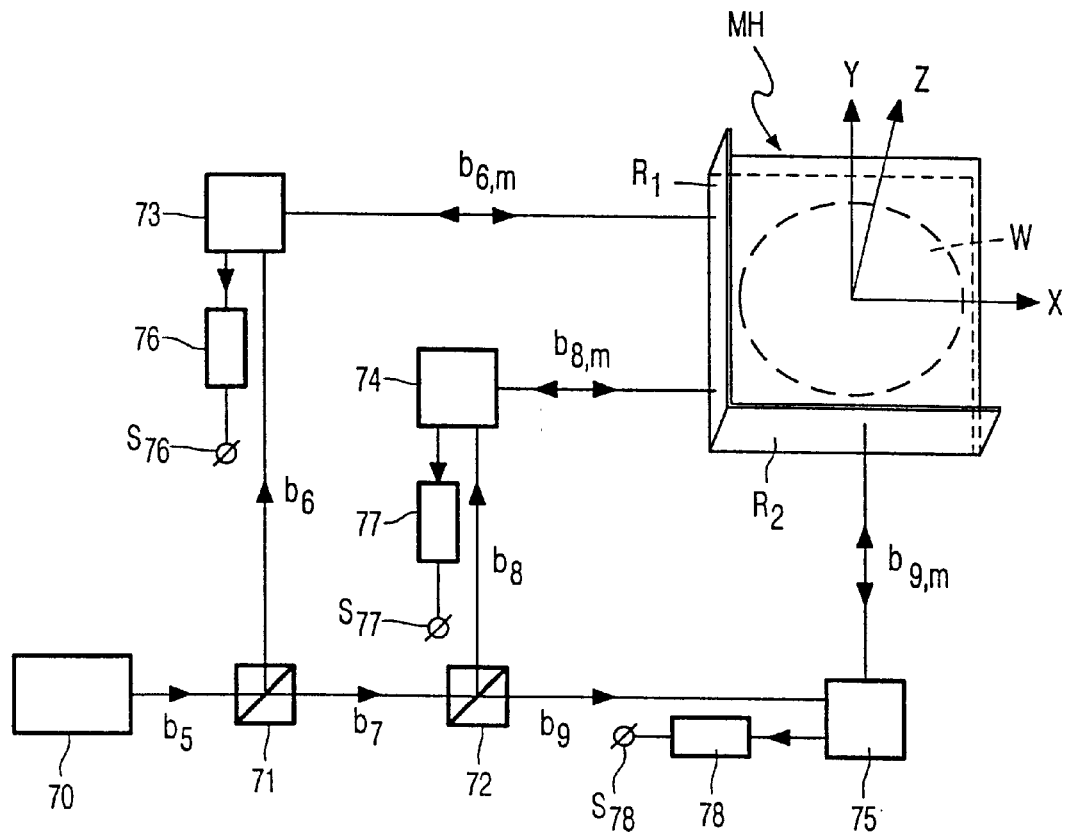
FIG. 2 shows a known interferometer system with three measuring axes for use in this apparatus.

An embodiment of an interferometer system with three measuring axes with which the movements and the positions of the substrate, or the mask, along the X axis and the Y axis can be measured, as well as a rotation of the substrate, or the mask, about the Z axis is described in the article "Linear/angular displacement interferometer for wafer stage metrology" in SPIE, vol. 1088: Optical/Laser Microlithography, pp. 268–272. FIG. 2 shows the diagram of such an interferometer system, together with the substrate holder WH. The composite interferometer system comprises a laser 70, for example a Helium-Neon laser, two beam splitters 71 and 72 and three interferometer units 73, 74 and 75. A part of the beam $b_5$ from the laser is reflected by the beam splitter 71 as beam $b_6$ to the interferometer unit 73 which co-operates with the mirror $R_1$ of the substrate holder WH. The beam $b_7$ passed by the beam splitter 71 is split by the beam splitter 72 into a beam $b_8$ which is reflected to the interferometer unit 74 and into a beam $b_9$ which is passed to the interferometer unit 75. The interferometer unit 74 co-operates with the measuring mirror $R_1$, while the interferometer unit 75 co-operates with the measuring mirror $R_2$.

Figure 3:
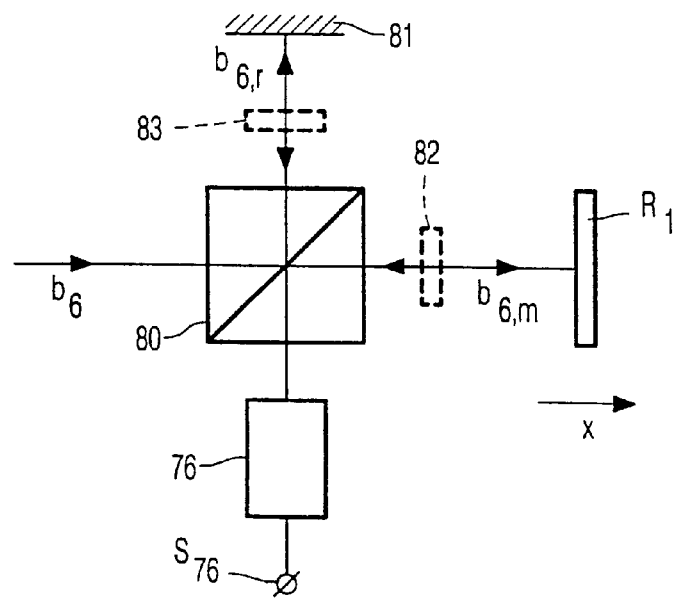
FIG. 3 shows the principle of a one-axis interferometer system.

FIG. 3 illustrates the principle of the interferometer unit 73. This unit comprises a beam splitter 80, for example, a partially transparent mirror which splits the incoming beam $b_6$ into a measuring beam $b_{6,m}$ and a reference beam $b_{6,r}$. The measuring beam is passed to the substrate holder mirror $R_1$ which reflects this beam to the beam splitter 80 which in its turn reflects a part of the beam $b_{6,m}$ to a detector 76. The reference beam $b_{6,r}$ reflected by the beam splitter 80 is reflected to the beam splitter 80 by a fixedly arranged reference mirror 81 which passes a part of this beam to the detector 76. When the substrate holder mirror is moved in the X direction, constructive and destructive interferences alternately occur between the beams $b_{6,m}$ and $b_{6,r}$ incident on the detector 76, so that the output signal of this detector passes from a maximum value to a minimum value, and conversely, whenever the substrate holder is displaced over a distance of $\lambda/4$, in which $\lambda$ is the wavelength of the beam $b_6$. The measured number of maxima and minima of the detector signal $S_{76}$ is a measure of the displacement of the substrate holder in the X direction. Movements of the mirror $R_1$ which are much smaller than $\lambda/4$, for example, up to $\lambda/128$ or even $\lambda/512$ can be measured by making use of electronic interpolation methods known in the interferometer technique.

The interferometer units 74 and 75 have the same construction and operate in the same way as the interferometer unit 73. The movement of the mask holder in the Y direction is measured by means of the interferometer unit 75 and the associated detector 78. A second measurement in the X direction is performed with the interferometer unit 74 and the associated detector 78. The rotation of the holder about the Z axis is computed from the signals $S_{76}$ and $S_{77}$. This rotation is given by:

$$\varphi_z = \frac{S_{76} - S_{77}}{d} \tag{7}$$

in which d is the distance between the points where the chief rays of the measuring beams $b_{6,m}$ and $b_{6,r}$ impinge upon the mirror $R_1$.

It is to be noted that FIG. 3 only shows the principle of an interferometer unit. In practice, a polarization-sensitive beam splitter 80 and a number of $\lambda/4$ plates, represented by the elements 82 and 83 in FIG. 3, will be used for beam splitting and combination. Then the radiation loss is minimal, which is particularly important if only one laser 70 is to be used for the different interferometer units. A Zeeman laser will preferably be used as a radiation source which emits a beam with two mutually perpendicularly polarized components and different frequencies. The beam components then constitute the measuring beam and the reference beam, and the measurement is then based on a phase measurement. Furthermore, retroreflectors as described in said article in SPIE, vol. 1088, Optical/Laser Microlithography II, pp. 268–272 may be incorporated in the interferometer units, which retroreflectors reflect a measuring beam after reflection by a measuring mirror to this measuring mirror again, so that the measurement performed with the relevant interferometer is independent of a tilt of the relevant measuring mirror.

To be able to perform the X, Y and $\phi_z$ measurement on the substrate with the desired accuracy by means of a three-axis interferometer system, the following two conditions should be fulfilled:
1. the chief rays of the interferometer beams must be located in a plane which coincides with the surface of the substrate.
2. during the displacements along the X axis and the Y axis and the possible rotation about the Z axis, the substrate holder must be fixed in the other degrees of freedom $\phi_{x,w}$ and $\phi_{y,w}$.

As described in EP-A 0 498 499, these conditions, which can hardly or not easily be fulfilled in practice, can be circumvented by making use of a five-axis interferometer system with which more movements of the substrate can be measured, so that this provides the possibility of measuring the X and Y movements more accurately.

Figure 4:
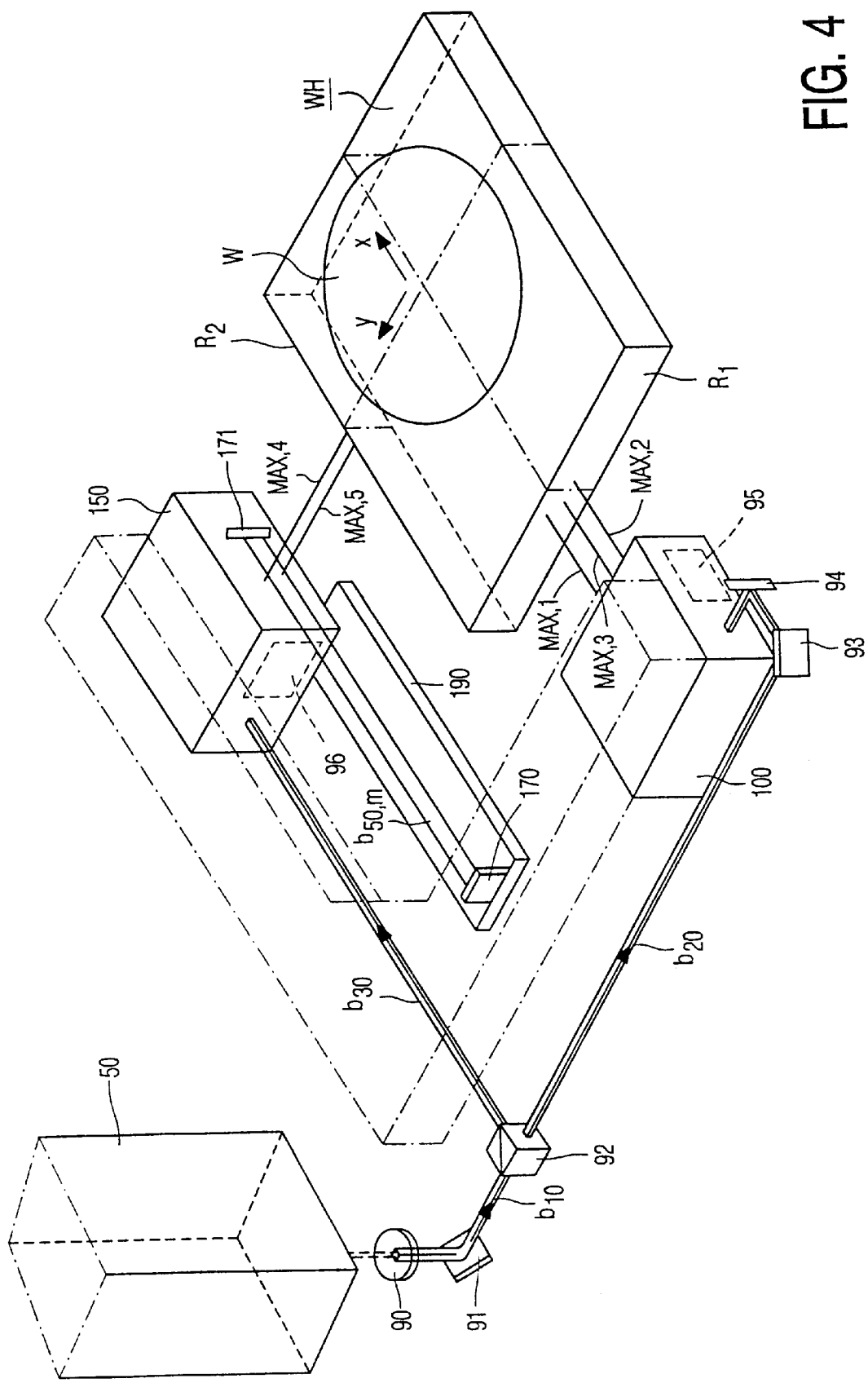
FIG. 4 is a perspective view of a known interferometer system with five measuring axes.

FIG. 4 shows the principle of such a system for measuring the five degrees of freedom: X, Y, $\phi_{x,w}$, $\phi_{y,w}$ and $\phi_{z,w}$, in which the substrate holder is provided with an integrated mirror block consisting of two mirrors $R_1$ and $R_2$. The system comprises, for example, two interferometer units 100 and 150 to which the beams $b_{20}$ and $b_{30}$ are supplied. These beams are emitted by a laser 50, for example a Helium-Neon laser, either or not of the Zeeman type. The beam $b_{10}$ coming from this laser first passes a beam-widening optical system diagrammatically shown by means of the lens 90 and is subsequently split into the two beams $b_{20}$ and $b_{30}$ by the beam splitter 92. The elements 91, 93 and 94 are reflectors which ensure that the beams are deflected in such a way that they are incident on the interferometer units 100 and 150 at the correct angles. The interferometer unit 100 may be implemented in such a way that it emits three measuring beams along the measuring axes MAX,1, MAX,2 and MAX,3 towards the measuring mirror $R_1$ and receives these beams from this mirror. With these beams, the displacement in the X direction, supplied from the signal by one of the axes MAX,1 and MAX,2, the tilt about the Y axis, from the difference of the signal supplied by the measuring axis MAX,3 and the signal of one of the measuring axes MAX,1 and MAX,2, and the rotation about the Z axis, from the difference of the signals of the measuring axes MAX,1 and MAX,2, of the substrate holder can be measured. The second interferometer unit emits two measuring beams along the measuring axes MAX,4 and MAX,5 to, and receives these beams from the measuring mirror $R_2$. With these beams, the displacement in the Y direction can be measured from the signal of one of the measuring axes MAX,4 and MAX,5, and the tilt $\phi_x$ about the X axis can be measured from the difference of the signals of these measuring axes, of the substrate holder and hence of the substrate. The measuring axes MAX,5 and MAX,3 are displaced with respect to the measuring axis MAX,4 and the measuring axes MAX,1 and MAX,2 in the Z direction, whereas the measuring axis MAX,1 with respect to the measuring axis MAX,2 is displaced in the Y direction. It has further been ensured that the measuring axes MAX,1, MAX,2 and MAX,4 are positioned as closely as possible to the surface of the substrate holder so that the Abbe errors are minimal and the measured X and Y displacements are optimally equal to the actual displacements of the substrate.

The interferometer units 100 and 150 may be implemented in various ways. For details, reference is made to EP-A 0 489 499 which is herein incorporated by reference.

According to the invention, the substrate interferometer system also has at least one Z measuring axis which co-operates with a Z measuring mirror which is rigidly secured to the substrate holder. The Z position of the substrate can thereby also be measured with the interferometer system. This Z measurement may serve as a supplement to, or as a substitute for, the above-described Z measurement by means of the focus error detection system or the focus-and-level detection system.

The Z measuring axis of the novel interferometer system may be the measuring axis of a separate interferometer unit. However, the Z measuring axis is preferably an extra measuring axis of an interferometer unit which is already present, for example the interferometer unit 100 as is shown diagrammatically in a front elevational view in FIG. 5. In this embodiment, one side face 159 of the substrate holder WH is provided with a beveled and reflective portion 160. This portion constitutes a Z measuring mirror $R_3$. The reflective straight portion 161 of the side face has the same function as the straight mirror $R_1$ in FIG. 4. The interferometer unit 100 does not only comprise the measuring axes MAX,2 and MAX,3 but also a Z measuring axis MAX,7 which is positioned as closely as possible to the upper face of the substrate holder. The measuring mirror $R_3$ reflects the measuring beam of the measuring axis MAX,7 to a further reflector, the Z reflector, 164 which is arranged on a plate 163 which is rigidly secured to the holder LH of the projection system and may form part of a larger metrology frame. The Z reflector reflects the measuring beam to the measuring mirror $R_3$ which in its turn reflects the measuring beam to the interferometer unit 100. This unit accommodates a separate detector for the Z measuring beam, whose output signal is processed together with other signals to form a Z measuring signal.

The Z measuring mirror 160 ($R_3$ in FIG. 5) is arranged at an angle of 45° to the XY plane, the plane in which the X and Y measuring beams propagate. In principle, the Z measuring mirror may also extend at a different acute angle to the XY plane. However, the angle of 45° is preferred because the Z measuring beam traverses the same path to and from the Z reflector 164 and the Z measuring mirror may then have a minimal width.

If the signals coming from the measuring axes MAX,2, MAX,3 and MAX,7 are denoted by $X_2$, $X_3$ and $Z_1$, respectively, the X position and the Z position in a system in which also the tilt $\phi_{ij}$ about the Y axis is measured are given by:

$$X = \frac{X_2 + X_3}{a} - b \cdot \varphi_{ij} \tag{8}$$

$$Z = Z_1 - X + c \cdot \varphi_{ij} \tag{9}$$

$$Z = Z_1 - X + c \cdot \phi_{ij} \tag{9}$$

in which $$\varphi_y = \frac{X_2 - X_3}{a} \tag{10}$$

in which
a is the distance between the two X measuring axes;
b is the distance between the upper face 162 of the substrate holder and the center of the two X measuring axes, and
c is the distance between the Z measuring axis and the upper face 162.

In this embodiment of the interferometer system, in which the Z measuring beam impinges upon the Z measuring mirror at a position which is proximate to the upper face of the substrate holder, and hence proximate to the substrate, possible tilts of the substrate have a negligible influence on the measured Z position of the substrate.

Associated with the Z measuring beam is a reference beam which, after having been reflected by a reference mirror, is combined on the Z detector with the measuring beam reflected by the Z measuring mirror 160 and Z reflector 163. This reference mirror may be a stationary mirror within the interferometer unit 100. The signal supplied by the Z detector then does not comprise pure Z position information, but the Z position information is mixed with X position information in that signal. For obtaining a pure Z position signal, the X position information must be removed from the detector signal, hence subtracted from this signal; in other words, an electronic differentiation must be used.

Figure 5:
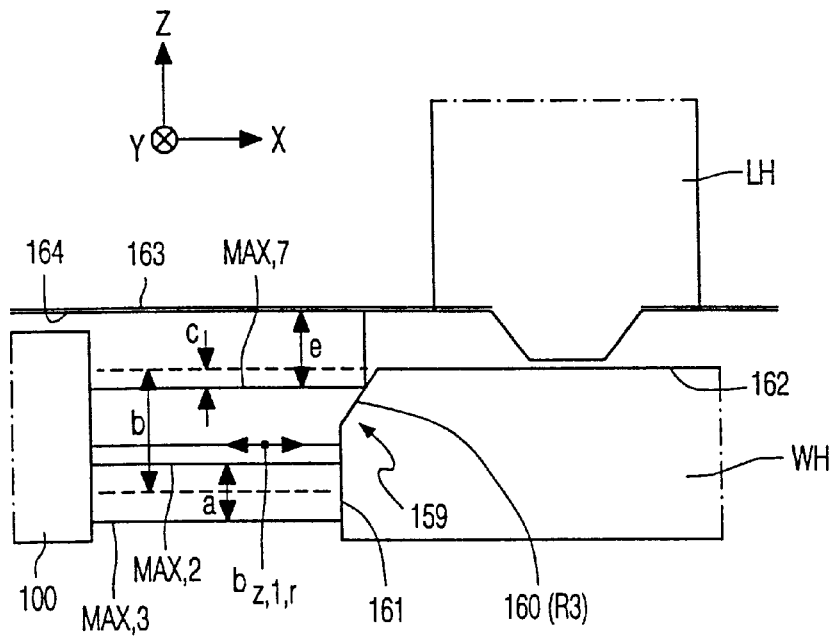
FIG. 5 shows an embodiment of a lithographic apparatus in which a Z measurement is performed.

Instead of a separate and stationary Z reference mirror, the X measuring mirror 161 is preferably used as a reference mirror for the Z measurement, as is shown in FIG. 5. The reference beam $b_{z,r}$ reflected by this mirror then comprises X position information so that the combination on the Z detector of this reference beam with the Z measuring beam results in the output signal of this detector being a pure Z position signal. Thus, an optical differentiation is performed which, as compared with an electronic differentiation, has the advantage that it cannot be limited by the processing speed of electronic circuits. The optical differentiation, hence the use of an X or Y measuring mirror as a reference mirror for the Z measurement, can also be used in the embodiments still to be described.

Figure 6:
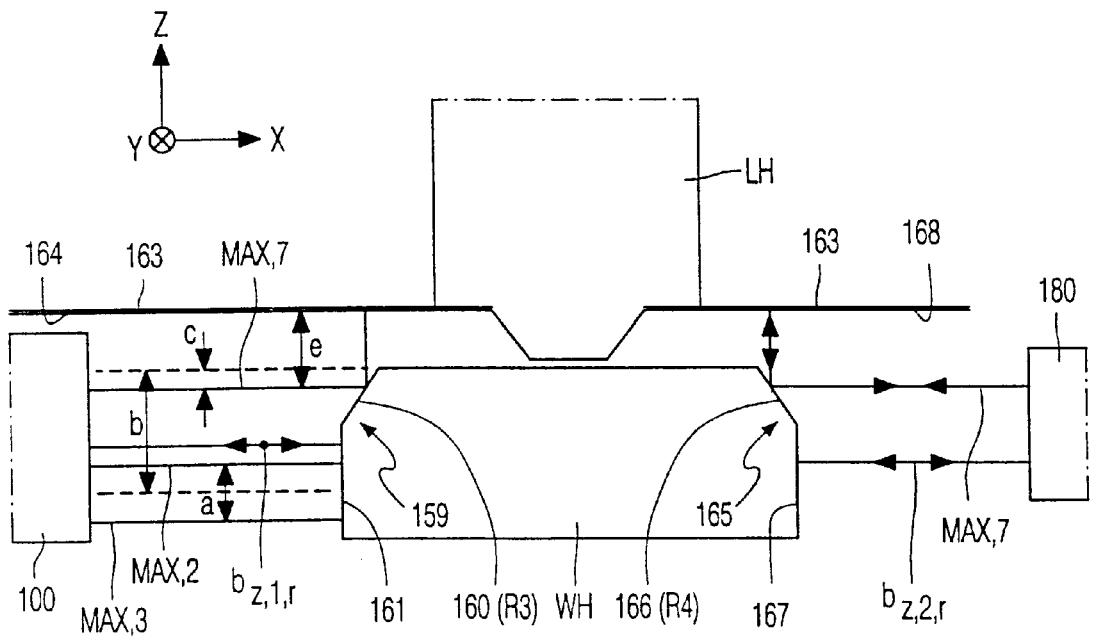
FIGS. 6 and 7 show a first and a second embodiment of a lithographic apparatus in which two Z measurements are performed.

FIG. 6 shows an embodiment of the interferometer system with which two Z measurements are performed. To this end, the side face 165 of the substrate holder WH opposite the first Z measuring mirror $R_3$ is also beveled and provided with a second Z measuring mirror $R_4$. This mirror co-operates with a second Z measuring beam which extends along the Z measuring axis MAX,8. The second Z measuring beam is reflected by the measuring mirror $R_4$ to a second Z reflector 168 which is arranged on the lower side of the plate 163. The second Z measuring beam is reflected by the Z reflector 168 to the measuring mirror $R_4$ which, in its turn, reflects the measuring beam to a detector associated with the measuring axis MAX,8. By adding the signals supplied by the measuring axes MAX,7 and MAX,8, the average Z position of the substrate can be determined. The value for the Z position thus obtained is independent of the X position of the substrate holder.

With the embodiment shown in FIG. 6, a signal which is indicative of a tilt of the substrate about the Y axis can also be obtained. This signal is proportional to the difference of the signals supplied by the MAX,7 and MAX,8 measuring axes.

Figure 7:
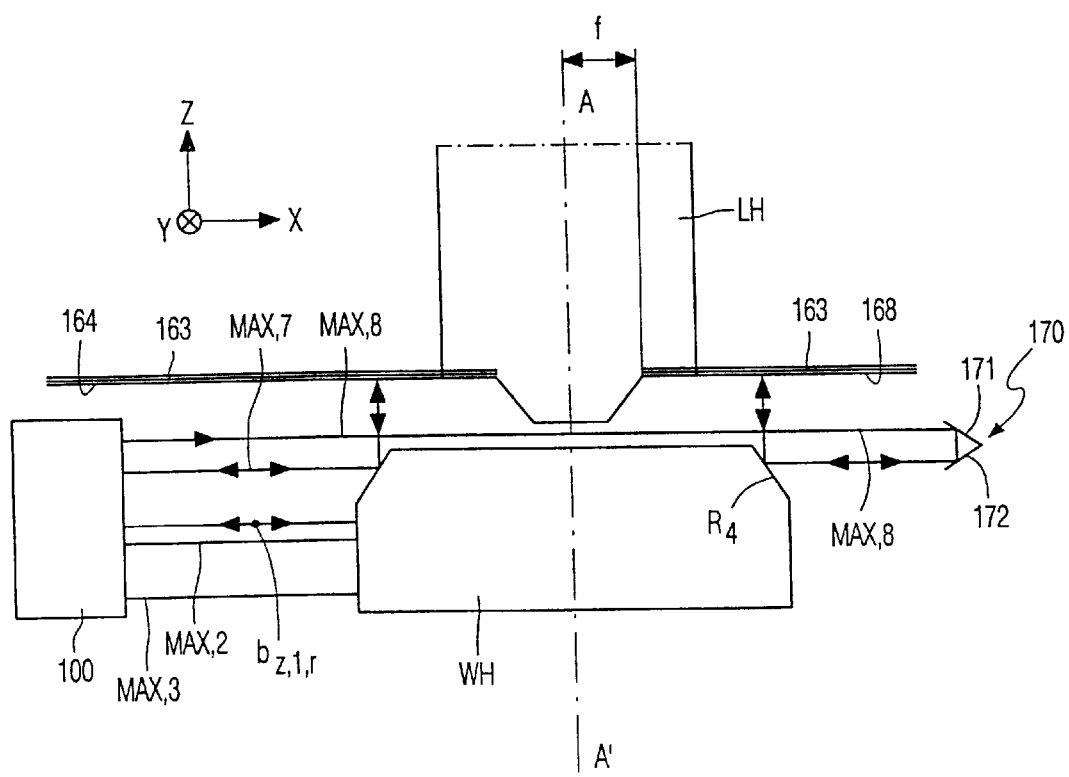

In the embodiment of FIG. 6, a separate interferometer unit 180 is required which is provided with an extra radiation source and accommodates the second Z detector. FIG. 7 shows an embodiment of the interferometer system in which no extra interferometer unit is required. In this embodiment, the measuring beam for the MAX,8 measuring axis is supplied by the interferometer unit 100 which also comprises the second Z detector. The measuring beam for the MAX,8 measuring axis traverses the space between the substrate and the projection lens and is reflected by a roof reflector 170 with two reflecting faces 171 and 172 to the Z measuring mirror $R_4$. The mirror $R_4$ reflects the measuring beam to the Z reflector 168 which, in its turn, reflects the measuring beam to the measuring mirror $R_4$, whereafter this beam traverses the reverse path to the detector unit 100. In this unit, the measuring beam is received by the aforementioned second detector.

The Z measuring mirrors $R_3$ and $R_4$ extend in the Y direction, the direction perpendicular to the plane of the drawing of FIGS. 5, 6 and 7 throughout the length of the substrate holder. If the lithographic apparatus is a step-and-scanner, the Y direction is the scanning direction so that the Z measurement can be performed throughout the scanning length.

In principle, the width of the Z measuring mirrors is equal to the diameter of the cross-section of the Z measuring beam at the area of this mirror, or is slightly larger if this beam traverses the path to the Z reflector twice. This means that this width can be limited and the surface of the Z measuring mirror can remain small. Due to their small total surface, the measuring mirrors can be manufactured in practice with the desired surface accuracy.

Figure 8:
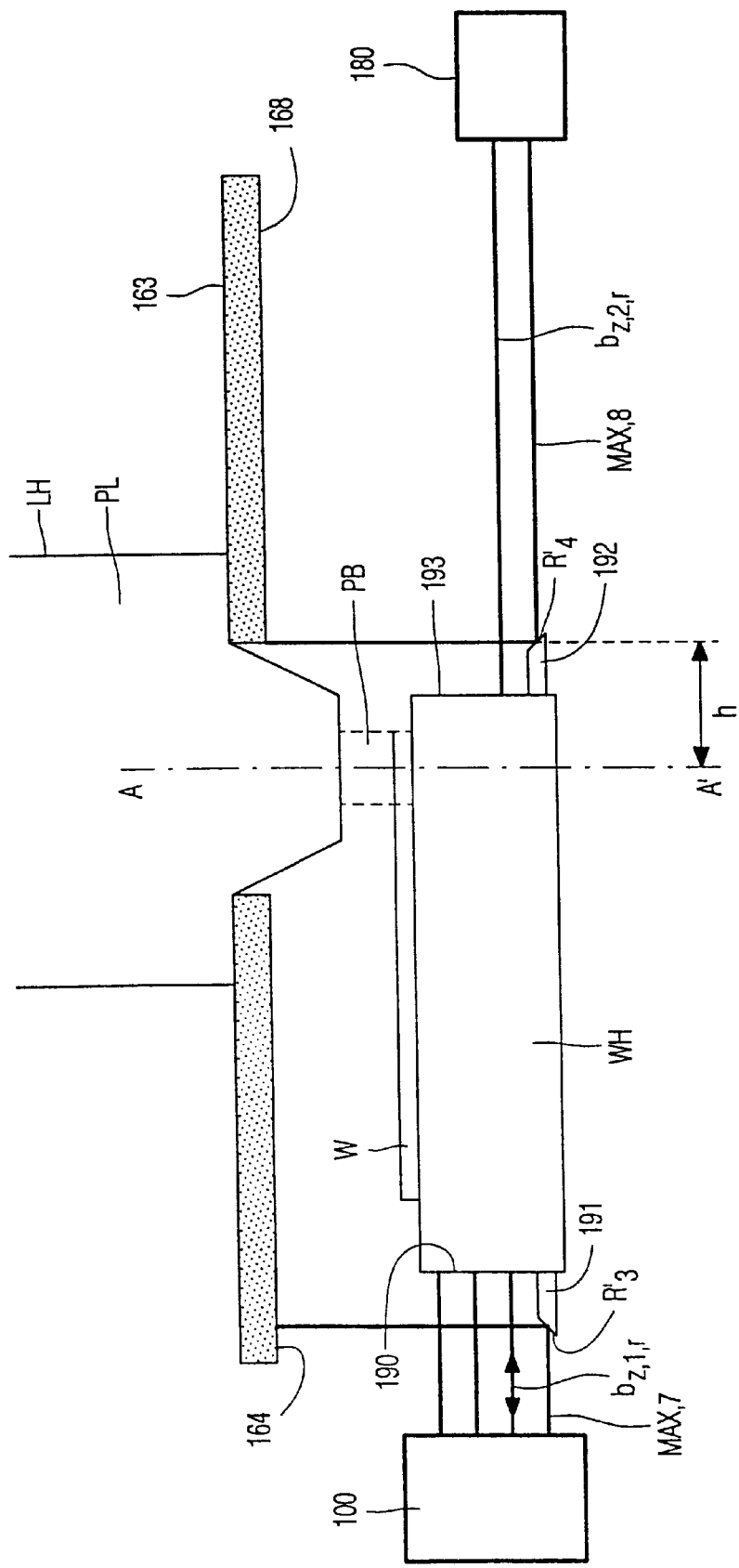
FIG. 8 shows an embodiment of a lithographic apparatus with an adapted Z measuring mirror.

As is shown in FIG. 7, there is a given distance f between the principal axis AA' of the projection lens system PL and the end of the Z reflector 168. This distance is, for example of the order of 70 mm. In order that a Z measurement can also be performed in an extreme X position of the substrate holder WH, in which the extreme right portion of the substrate is illuminated, as is indicated in FIG. 8, the distance h between the axis AA' and the measuring mirror $R_4$ should be at least equal to the distance f for that position. This may mean that, for the purpose of the Z measurement, the width of the substrate holder in the X direction should be increased by a given value. If, in addition to a Z measurement via the MAX,8 measuring axis, also a Z measurement via the MAX,7 measuring axis is performed, the width of the substrate holder should be increased by twice this value. Since the substrate holder should also have a given height in order that both the Z measuring mirror(s) and the X and Y measuring mirrors can be arranged on its side faces, a larger dimension in the X direction will considerably increase the weight of the holder. This is less desirable because of the required drive forces for the holder and stability requirements. A Z measuring mirror is therefore preferably arranged on a bar-shaped element having a beveled side face, which element is rigidly connected to the substrate holder.

FIG. 8 shows an embodiment of the interferometer system in which the two Z measuring mirrors $R_3$ and $R_4$ are arranged on bar-shaped elements 191, 192. Now, the required width for a measuring mirror is also equal to or slightly larger than the diameter of the cross-section of the measuring beam at the area of this mirror so that the dimension in the Z direction of the bar-shaped element can be limited. The extra weight added to the substrate holder to render it suitable for performing the described Z measurement is thereby limited. As is shown in FIG. 8, the two Z measuring mirrors are arranged on the lower part of the substrate holder. Consequently, the X measuring axes associated with the interferometer unit 100 can be positioned proximate to the upper face of the substrate holder so that the risk of Abbe errors for these measuring axes can be reduced. Moreover, a maximal portion of the side faces of the substrate holder and a maximal space between the projection system and the substrate holder are then available for performing measurements other than the measurements described and being irrelevant to the present invention.

The spots on the substrate holder WH marked with MAX,4 and MAX,5 in FIG. 8 are the positions where the measuring beams of the interferometer unit 150 (FIG. 4) associated with the measuring axes MAX,4 and MAX,5 impinge upon the X measuring mirror arranged on this side face of the substrate holder.

In FIG. 8, the reference beams associated with the Z measuring axes MAX,7 and MAX,8 and leading to the X measuring mirrors 190 and 193 are denoted by $b_{z,1,r}$ and $b_{z,2,r}$. As described above, these reference beams are used for performing the optical differentiation. This optical differentiation is particularly important if, as desired in practice, the substrate holder is moved at great speeds and accelerations. Then, the detector signals change very rapidly. For obtaining sufficiently accurate and reliable measurements, the interferometer system would have to be provided with very fast signal-processing circuits when using Z reference beams which do not lead to X or Y measuring mirrors. This is not necessary if optical differentiation is applied.

FIG. 8 also shows the projection beam PB. In the case of a step-and-scanning lithographic apparatus, this beam has an oblong, for example rectangular, cross-section at the area of the substrate, whose longitudinal direction is parallel to the X direction. Upon each image of the mask pattern on an IC field of the substrate, this beam is moved in the Y direction across the substrate by moving the mask and the substrate in the Y direction with respect to the projection beam and the projection lens system.

Figure 9:
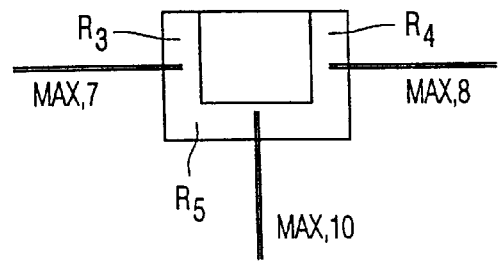
FIG. 9 shows a substrate holder with three Z measuring mirrors and three Z measuring axes.

In a further embodiment, the interferometer system comprises three Z measuring axes and the substrate holder is provided with three Z measuring mirrors. FIG. 9 is a very diagrammatic plan view of the substrate holder with three Z measuring mirrors $R_3$, $R_4$ and $R_5$ and the associated Z measuring axes MAX,7, MAX,8 and MAX,10. Since the Z position of the substrate is measured at three points with respect to one and the same reference, the reflecting lower side of the plate 163, the joint Z measuring axes can supply information, not only about the Z position but also about possible tilts about the X axis and the Y axis of the substrate. These tilt measurements may replace these measurements with the aid of the measuring axes MAX,3 and MAX,5 so that the total number of measuring axes can be reduced to six. However, it is alternatively possible to utilize the tilt measurements by means of the Z measuring axes as additional measurements, for example for checking the tilt measurements by means of the MAX,3 and MAX,4 measuring axes.

Figure 10:
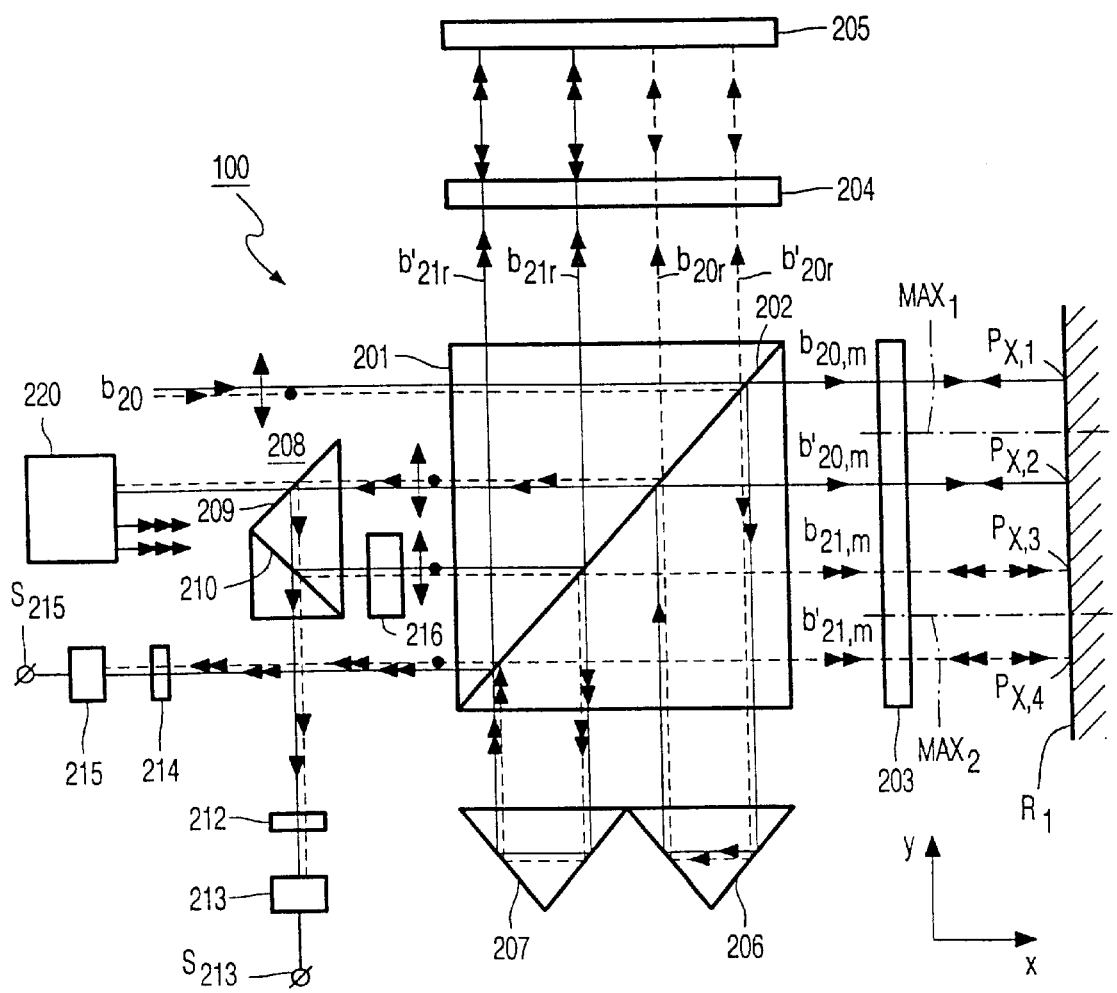
FIG. 10 shows a first part of a first embodiment of an interferometer unit with a Z measuring axis.

FIG. 10 shows an embodiment of an interferometer unit, for example the unit 100 of FIG. 4, which is provided with a Z measuring axis. This unit comprises a polarization-sensitive beam splitter 201, two $\lambda/4$ plates 203, 204, a reference reflector 205, two retroreflectors 206, 207, a composite prism 208 and two detectors 213, 215. The two detectors may be arranged on the plane 95 of the interferometer unit 100 shown in FIG. 4. The interferometer unit is of the heterodyne type. The beam $b_{20}$ then comes from a Helium-Neon laser which is implemented as a Zeeman laser. Such a laser supplies a beam with two mutually perpendicularly polarized components which have an optical frequency difference of, for example 6 MHz. These two components are shown in FIG. 10 by means of solid lines and broken lines, respectively. These radiation components may also be obtained with the combination of a normal laser, beam splitters and acousto-optical modulators as described in U.S. Pat. No. 5,485,272 (PHN 14.702).

The beam $b_{20}$ entering the prism 201 is split into a measuring beam $b_{20,m}$ and a reference beam $b_{20,r}$ by the polarization-sensitive interface 202. The beam $b_{20,m}$ is passed to the measuring mirror $R_1$ of the substrate holder and is reflected at the position $P_{x,1}$ by this mirror. A $\lambda/4$ plate 203 ensuring that the direction of polarization of the reflected measuring beam, which has traversed the $\lambda/4$ plate twice, is rotated through 90° with respect to the direction of polarization of the incoming beam $b_{20}$ is arranged between the prism 201 and the mirror $R_1$. The reflected measuring beam is then reflected by the interface 202 to a retroreflector 206, for example, in the form of a three-dimensional corner cube prism. The beam reflected by this prism is subsequently reflected by the interface 202 and sent as measuring beam $b'_{20,m}$ to the measuring mirror $R_4$ again and reflected by this mirror at the position $P_{x,2}$ to the prism 201 again. This beam has then again traversed the $\lambda/4$ plate 203 twice so that its direction of polarization is rotated through 9020 again and the beam is passed by the interface 202. The beam $b'_{20,m}$ subsequently reaches the prism system 208 and is reflected by its surface 209 and ultimately reaches a radiation-sensitive detector 213 via a polarization analyzer 212.

The reference beam $b_{20,r}$ reflected by the interface 202 traverses the $\lambda/4$ plate 204, is reflected by the reference reflector 205 and traverses the $\lambda/4$ plate a second time. The direction of polarization of the beam $b_{20,r}$ incident on the interface 202 is rotated through 90° so that this beam is passed on to the retroreflector 206. The beam $b'_{20,r}$ reflected by this element is again sent as a reference beam to the reference reflector 205 and reflected by this reflector to the interface 202, the direction of polarization being rotated through 90° again. The interface subsequently reflects the beam to the prism system 208 whose face 209 reflects the beam $b'_{20,r}$ to the detector 213. The direction of polarization of the analyzer 212 extends at an angle of 45° to the two mutually perpendicular directions of polarization of the beams $b'_{20,m}$ and $b'_{20,r}$. The components of these beams passed by the analyzer have the same direction of polarization and interfere with each other. The output signal $S_{213}$ of the detector 213 has an intensity modulation at a frequency which is equal to the Zeeman frequency difference plus or minus a frequency shift which is dependent on the displacement of the measuring mirror $R_1$ in the X direction.

In principle, the retroreflector 206 may also be omitted so that the measuring beam and reference beam incident on the detector 213 would only be reflected once by the substrate measuring mirror $R_1$. The special embodiment of the interferometer unit 100 in FIG. 10, in which a retroreflector 206 is used to reflect the measuring beam twice as beams $b_{20,m}$ and $b'_{20,m}$ on the measuring mirror, has the great advantage that the direction of the measuring beam $b'_{20,m}$ ultimately incident on the detector 213 is independent of a possible rotation of the mirror $R_1$ about an axis perpendicular to the X axis. The signal $S_{213}$ then comprises only pure X displacement information. For the same reason, a possible rotation of the reference reflector 205 does not have any influence on the signal $S_{213}$.

The rotation of the substrate holder about the Z axis, which is perpendicular to the plane of the drawing in FIG. 10, can also be measured by means of the interferometer unit of FIG. 10. This is realized by a second X measurement at a position $P_{x,3}$ ($P_{x,4}$) at a maximal distance from the position $P_{x,1}$ ($P_{x,2}$) where the first X measurement is performed. To this end, the face 210 of the prism system 208 is implemented as a partially transparent mirror which sends a portion of the measuring beam $b'_{20,m}$ and the reference beam $b'_{20,r}$ as a new reference beam $b_{21,r}$ and a new measuring beam $b_{21,m}$, respectively, to the beam-splitting prism 201. The direction of polarization of the two beams is first rotated through 90° by a λ/2 plate so that the functions of these beams are interchanged. The measuring beam $b_{21,m}$ is passed to the substrate measuring mirror $R_1$ by the polarization-sensitive interface 202, while the reference beam $b_{21,r}$ is reflected to the reference reflector 205. The paths traversed by the beams $b_{21,m}$ and $b_{21,r}$ are equal to those traversed by the beams $b_{20,m}$ and $b_{20,r}$. Preferably, a second retroreflector 207 is provided which ensures that the measuring beam and the reference beam are sent a second time to the substrate measuring mirror $R_1$ and the reference reflector 205 as beams $b'_{21,m}$ and $b'_{21,r}$, respectively. Via the prism system 208 and a second polarization analyzer 214, the measuring beam $b'_{21,m}$ and reference beam $b'_{21,r}$ reflected a second time reach a second detector 215 where these beams interfere with each other.

The output signal $S_{215}$ of this detector has an intensity modulation at a frequency which is equal to the Zeeman difference frequency plus or minus a frequency shift which, however, is now dependent on a possible rotation of the measuring mirror $R_1$ about the Z axis. In fact, if such a rotation occurs, the frequency shift between the measuring beam and the reference beam at their first passage through the system, at which reflections occur at the positions $P_{x,1}$ and $P_{x,2}$, is different from the frequency shift at the second passage through the system, at which reflections occur at the positions $P_{x,3}$ and $P_{x,4}$. The frequency difference measured by means of the detector 215 is the difference between said frequency shifts. If the substrate measuring mirror $R_1$ does not have a rotation about the Z axis, the resultant frequency difference is equal to zero.

For the way in which the signals $S_{213}$ and $S_{215}$ can be electronically processed so as to derive the X displacement and the rotation $\phi_z$ about the Z axis of the substrate holder from the frequency shifts, reference may be made by way of example to the article in SPIE, vol. 1088 "Optical/Laser Microlithography", II, 1989, pp. 268–272.

Instead of a beam $b_{20}$ with two frequency components, a beam having only one frequency may be used, the displacement or rotation of the measuring mirror $R_1$ is then measured by determining the phase difference between the measuring beam and the reference beam.

Figure 11:
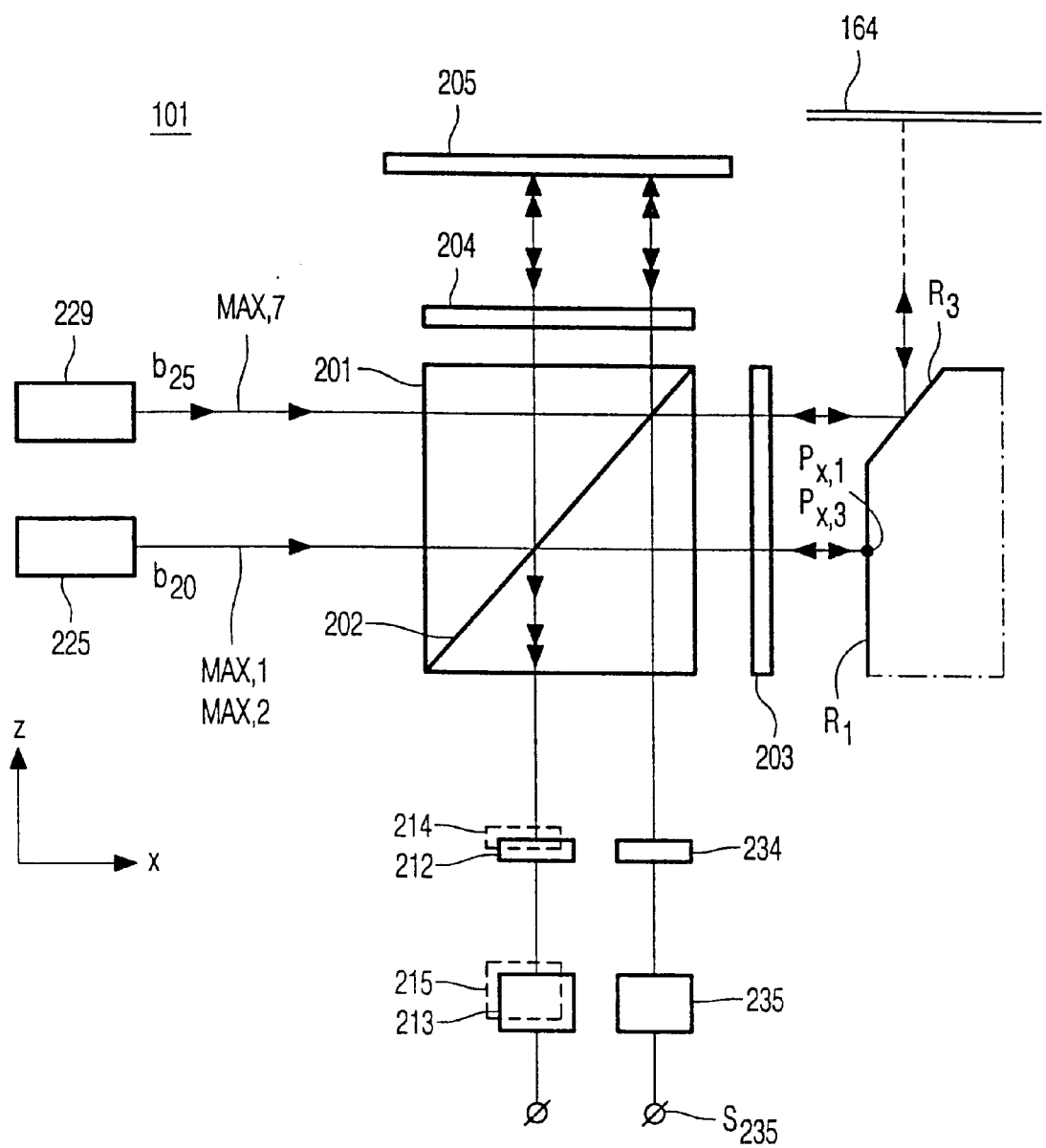
FIG. 11 shows a second embodiment of such an interferometer unit.

According to the invention, the interferometer unit 100 may be extended so that it can perform a Z measurement. FIG. 11 shows an embodiment in a cross-section taken on an XZ plane of an interferometer unit 101 which is provided with a Z measuring axis. This unit comprises, for example, a first radiation source 225 which supplies the beam $b_{20}$ for the X measuring axes MAX,1 and MAX,2, and a second radiation source 229 which supplies the beam $b_{25}$ for the Z measuring axis MAX,7.

The beam $b_{25}$ is split by the polarization-sensitive splitting prism 201 into a measuring beam $b_{25,m}$ and a reference beam $b_{25,r}$. The measuring beam $b_{25,m}$ is passed by the interface to the Z measuring mirror $R_3$. This mirror reflects the measuring beam to the Z reflector 164 which sends the beam back to the measuring mirror $R_3$. This mirror reflects the beam $b_{25,m}$ to the interface 202 again. Since upon its second arrival on the interface, the beam $b_{25,m}$ has traversed the λ/4 plate 203 twice, and thus, its direction of polarization is rotated through 90° with respect to the original direction of polarization of this beam, the beam $b_{25,m}$ is reflected by the interface to a Z detector 235.

The reference beam $b_{25,r}$ is reflected by the interface 202 to the reference reflector 205 and reflected by this reflector to the interface, at which this beam passes the λ/4 plate 204 twice. Upon arrival at the interface 202, the direction of polarization of the beam $b_{25,r}$ is rotated through 90° with respect to the original direction of polarization of this beam, so that the beam $b_{25,r}$ is passed by the interface to the detector 235. A polarization analyzer 234 precedes this detector so that components of the beams $b_{25,m}$ and $b_{25,r}$ can interfere with each other at the area of the detector 235. The output signal $S_{235}$ of this detector has an intensity modulation at a frequency which is equal to the Zeeman frequency plus or minus a frequency component which is dependent on the displacement in the Z direction of the Z measuring mirror with respect to the Z reflector 164. For obtaining a pure Z position signal, the X position signal of the detector 213 or 215, or a combination of these signals must be subtracted from the output signal of the detector 235.

The points $P_{x,1}$ and $P_{x,3}$ in FIG. 11 are the points where the X measuring axes intersect the X measuring mirror. Since no retroreflectors are used in this embodiment and the X measuring beams are reflected only once by the measuring mirror $R_1$, the measuring axes MAX,1 and MAX,2 coincide with the principal axes of these measuring beams. These measuring beams are reflected by the interface 202 to the detectors 213 and 215, respectively, where also the associated reference beams arrive after they have been reflected by the reference reflector 205. Also the Z measuring beam traverses the path to the Z reflector 164 and vice versa only once in this embodiment via the Z measuring mirror so that also the measuring axis MAX,7 coincides with the principal axis of the Z measuring beam.

Instead of two separate radiation sources, the combination of a radiation source and a polarization-neutral beam splitter may be alternatively used in the interferometer unit with a Z measuring axis for supplying the beams $b_{20}$ and $b_{25}$. Instead of a beam with two frequency components, one beam with only one frequency may be used for each of the beams $b_{20}$ and $b_{25}$. The displacement of the relevant measuring mirror is then measured by determining the phase difference of the associated measuring beam and reference beam.

Figure 12:
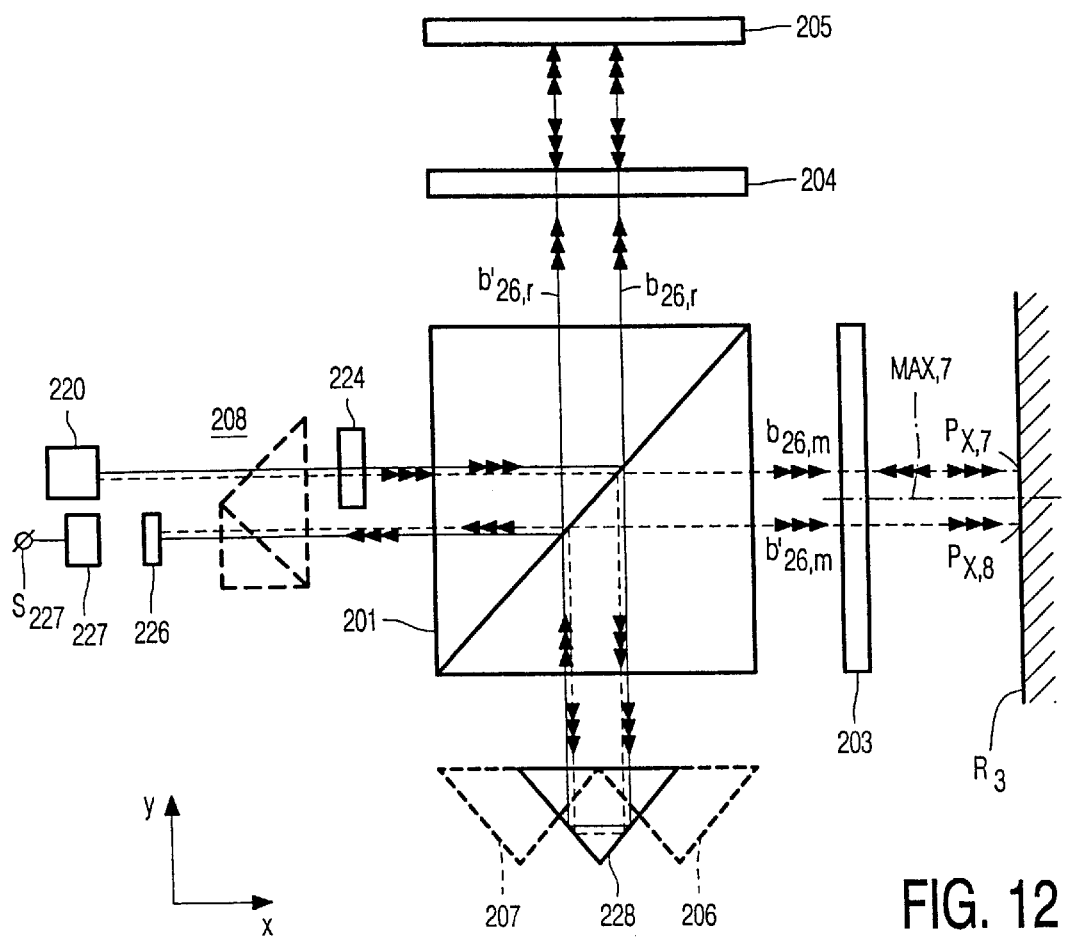

As is diagrammatically shown by means of the block 220 in FIG. 10, an X measuring beam $b'_{20,m}$ which is reflected by the mirror $R_1$ may also be used as a Z measuring beam. To this end, the surface 209 of the prism system 208 is implemented as a partially transparent reflector which passes a portion of the beams $b'_{20,m}$ and $b'_{20,r}$. A reflector system 220 is arranged in the path of the passed beam components which are used as Z measuring beam and reference beam $b_{26,m}$ and $b_{26,r}$. This system reflects the beams $b_{26,m}$ and $b_{26,r}$ to the beam splitter 201 and displaces the beams parallel to themselves in the Z direction so that the beams will extend in a second XY plane which is located in front of the plane of the drawing in FIG. 10, so that the Z measuring beam can reach the Z measuring mirror $R_3$. Said second XY plane is shown in FIG. 12, together with the Z measuring beam $b_{26,m}$ and the Z reference beam $b_{26,r}$.

The path of the beams $b_{26,m}$ and $b_{26,r}$ incorporates, in front of the beam splitter 201, a $\lambda/2$ plate 224 which rotates the direction of polarization of these beams through 90°, so that the functions of the reference beam and the measuring beam are interchanged. Preferably, a retroreflector 228 is provided for the Z measuring beam, so that this beam is reflected twice as beams $b_{26,m}$ and $b'_{26,r}$ at the positions $P_{x,7}$ and $P_{x,8}$, respectively, by the Z measuring mirror to the Z reflector 164, and the reference beam is reflected twice as beams $b_{26,r}$ and $b'_{26,r}$ by the reference mirror 205. The paths traversed by the Z measuring beams and Z reference beams through the interferometer unit are analog to those traversed by the X measuring beams and X reference beams.

The beams $b'_{26,m}$ and $b'_{26,r}$ ultimately reach a polarization analyzer 226 which passes the components having the same direction of polarization of these beams, which components interfere with each other, to a detector 227. The output signal $S_{227}$ of this detector has an intensity modulation at a frequency which is equal to the Zeeman difference frequency plus or minus a frequency component which is dependent on the displacement of the Z measuring mirror in the Z direction. In fact, if such a displacement occurs, the frequency shift between the measuring beam $b'_{26,m}$ and the reference beam $b'_{26,r}$ is different from the frequency shift between the measuring beam $b'_{20,m}$ and the reference beam $b'_{20,r}$. The frequency difference measured by means of the detector 227 is the difference between these frequency shifts. If there is no displacement in the Z direction, the resultant frequency difference is equal to zero.

Figure 13:
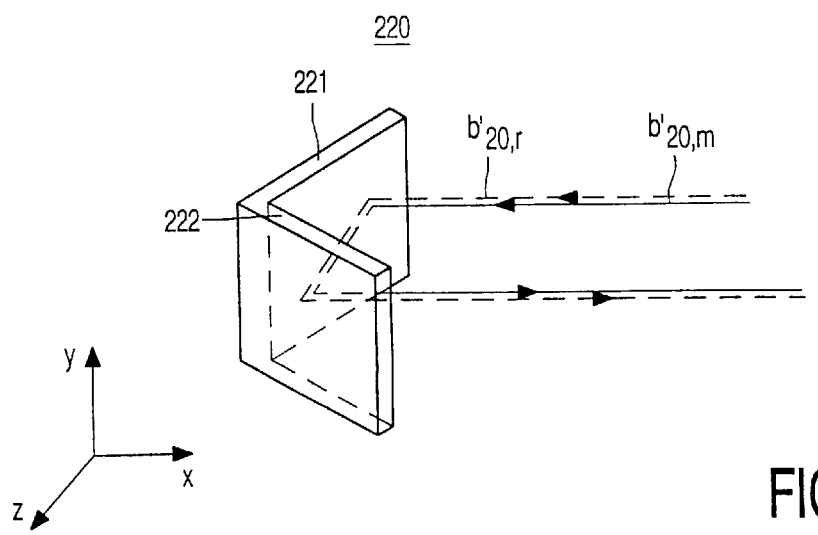
FIG. 13 shows a reflector system used in this unit.

FIG. 13 shows an embodiment of the reflector system 220 in detail. This system comprises a first reflector 221 which reflects the beams $b'_{20,m}$ and $b'_{20,r}$ extending parallel to the X axis in the direction of the Z axis, and a second reflector 222 which reflects these beams again in a direction parallel to the X axis. The reflector pair 221, 222 thus displaces the beams parallel to themselves along the Z axis.

In the embodiments described, the measuring beam and the associated reference beam are preferably parallel to each other for each measuring axis so as to prevent an interference pattern instead of a single radiation spot from occurring at the location of the associated detector. This parallelism, which is determined by the planeness of the surfaces of the beam splitter 201, of the prism system 208 and of the reflector system 220, and by the angle between the surfaces 209 and 210 of the prism system 208 and the angle between the surfaces 221 and 222 of the reflector system, can be satisfactorily realized in practice because said surfaces can be accurately flattened within 3 angle seconds and because said angles can be made accurately equal to 90°. The reflector system 220 is preferably integrated with the prism system 208 so as to avoid alignment problems during assembly and to ensure stability with time.

The interferometer units shown in FIGS. 10, 11, and 12 have the advantage that the measuring beam and reference beam associated with a measuring axis are symmetrical with respect to the beam splitter 201 and have the same path lengths through this beam splitter. This substantially eliminates the risk of instabilities.

In the device according to FIGS. 10 and 12, the differences between the signals associated with the measuring axes MAX,1, MAX,2 and MAX,7, which differences are required for measuring the rotation about the Z axis and the Z position, are determined optically. If the information obtained via these measuring axes is represented by $I_{MAX,1}$, $I_{MAX,2}$ and $I_{MAX,3}$, the detector signals $S_{213}$, $S_{215}$ and $S_{227}$ in the embodiment of FIGS. 10 and 12 are given by:

$$S_{213} = I_{MAX,1} \tag{11}$$

$$S_{215} = I_{MAX,1} - I_{MAX,2} \tag{12}$$

$$S_{227} = I_{MAX,1} - I_{MAX,7} \tag{13}$$

The signals $S(X)$, $S(Z)$ and $S(\phi_2)$ which comprise information about the magnitude and direction of the displacement along the X axis and the Z axis, and the rotation about the Z axis then are:

$$S(X) = \frac{I_{MAX,1} + I_{MAX,2} + I_{MAX,3}}{3} \tag{14}$$

$$S(\varphi_2) = \frac{I_{MAX,1} - I_{MAX,2}}{g} \tag{15}$$

$$S(Z) = \frac{I_{MAX,1} - I_{MAX,3}}{h} \tag{16}$$

Figure 14:
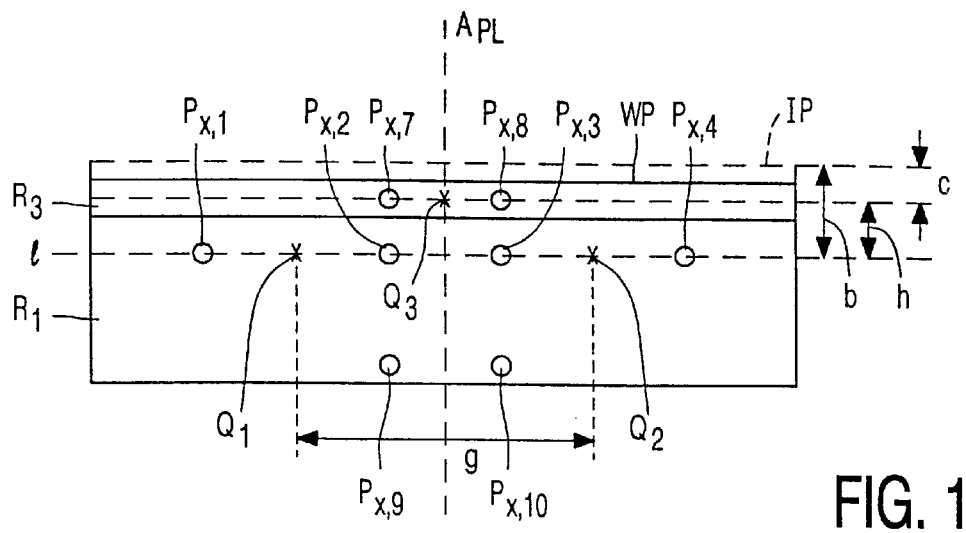
FIG. 14 shows the positions where the measuring beams and the measuring axes of the interferometer unit impinge upon the measuring mirrors arranged on the substrate holder.

The parameters g and h are indicated in FIG. 14. In this Figure, the points where the chief rays of the measuring beams $b_{20,m}$, $b'_{20,m}$, $b_{21,m}$, $b'_{21,m}$, $b_{26,m}$ and $b'_{26,m}$ are incident on the mirrors $R_1$ and $R_3$, are denoted by the circles $P_{x,1}$, $P_{x,2}$, $P_{x,3}$, $P_{x,4}$, $P_{x,7}$ and $P_{x,8}$, respectively. A measuring axis denoted by MAX,1, MAX,2 and MAX,7 in the previous Figure is associated with each pair of measuring beams. The points where these measuring axes are incident on the mirrors $R_1$ and $R_2$ are denoted by $Q_1$, $Q_2$ and $Q_3$ in FIG. 14. With the aid of these signals, and taking calibration parameters in connection with the Abbe error into account, the X position, the Z position and the rotation about the Z axis can be determined.

As already noted, it is preferable that the difference between the signals associated with the different measuring axes are determined optically, i.e., to use the optical differentiation described with reference to FIGS. 10, 12, and 13. Under circumstances, an electronic differentiation may be used as an alternative. Then, three separate beams should be supplied to the beam splitter, as is shown in FIG. 15.

The path of the beam $b_{20}$ incorporates, in front of the polarization-sensitive beam splitter 201, a polarization-neutral beam splitter 230 which splits the beam $b_{20}$ into a first and a second beam $b_{41}$ and $b_{42}$ whose principal axes are located in a first XY plane, the plane of the drawing in FIG. 14, and a third beam $b_{43}$ whose principal axis is located in a second XY plane in front of the plane of the drawing in FIG. 14. The beam splitter 230 comprises a combination of partially or not partially transparent reflectors and may be implemented in various ways. For example, the reflectors may be faces of plane-parallel plates, so that the beams $b_{41}$, $b_{42}$ and $b_{43}$ are satisfactorily parallel. Each of these beams is split by the interface 202 into a measuring beam and a reference beam $b_{41,m}$ and $b_{41,r}$, $b_{42,m}$ and $b_{42,r}$, and $b_{43,m}$ and $b_{43,r}$, respectively. For the sake of clarity, only a part of the radiation path is shown for the reference beam $b_{41,r}$.

Preferably, retroreflectors 206, 207 and 228 are arranged in the paths of the beams $b_{41}$, $b_{42}$ and $b_{43}$, so that the measuring beams $b'_{41,m}$, $b'_{42,m}$ and $b'_{43,m}$ ultimately leaving the beam splitter 201 are reflected twice by the associated measuring mirror $R_1$ or $R_3$. Each measuring beam, together with the associated reference beam, is incident on a separate detector 213, 215 or 227 via an analyzer 212, 214 and 226.

Figure 15:
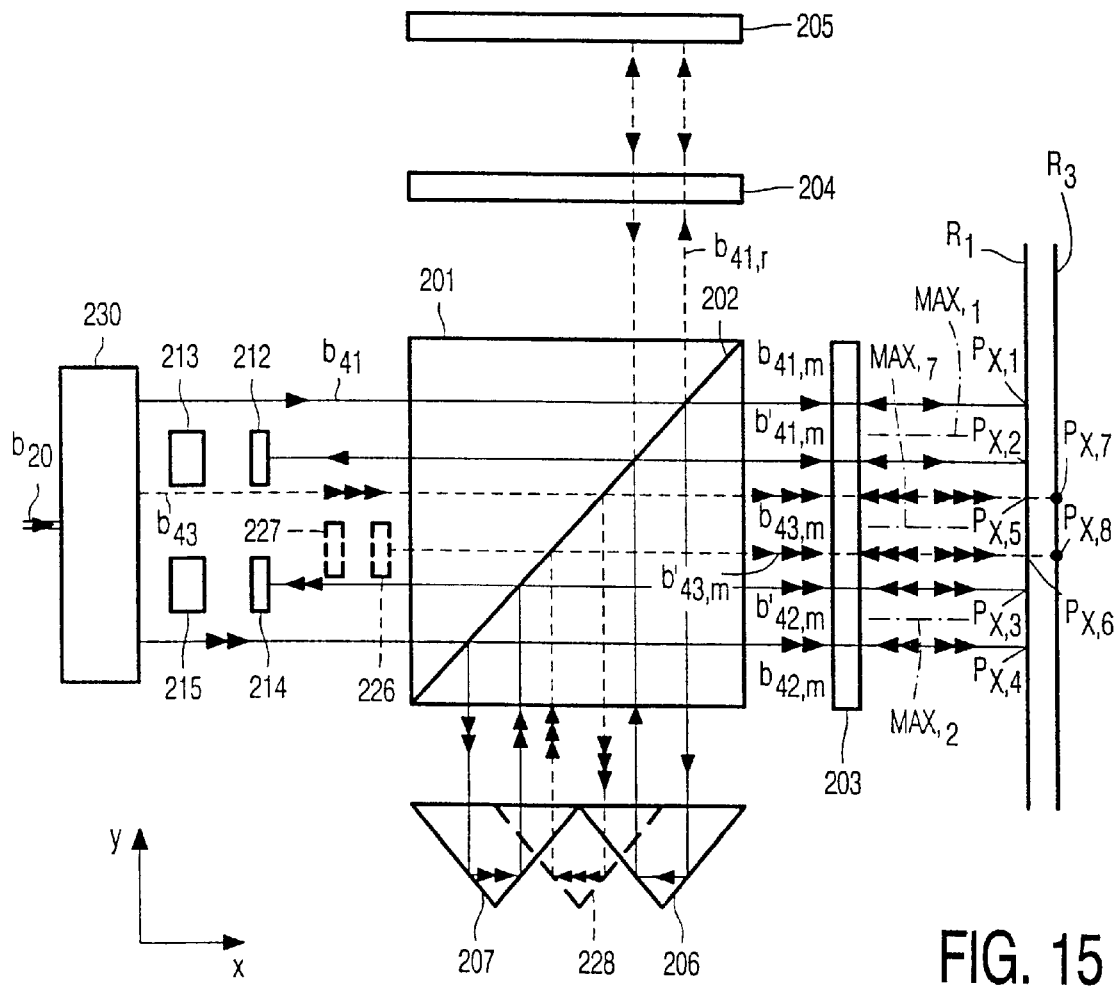
FIG. 15 shows a further embodiment of an interferometer unit with two Z measuring axes.

In the embodiment of FIG. 15, the relationship between the detector signals $S_{213}$, $S_{215}$ and $S_{227}$ and the information obtained via the measuring axes is:

$$S_{213}=I_{MAX,1} \quad (17)$$

$$S_{215}=I_{MAX,2} \quad (18)$$

$$S_{227}=I_{MAX,7} \quad (19)$$

The measuring signals $S(x,)$, $S(\phi_2)$ and $S(Z)$ may now be:

$$S(X) = \frac{I_{MAX,1} + I_{MAX,2} + I_{MAX,7}}{3} \quad (20)$$

$$S(\varphi_2) = \frac{I_{MAX,1} - I_{MAX,2}}{g} \quad (21)$$

$$S(Z) = \frac{\frac{I_{MAX,1} + I_{MAX,2}}{2} - I_{MAX,7}}{h} \quad (22)$$

The choice between a device with three independent measuring axes and a device with three coupled measuring axes may be determined by the speed of movement of the substrate holder, hence the rate at which the information of the measuring axes changes, on the one hand, and the speed of the signal-processing electronic units, on the other hand. At large speeds of the substrate holder, a device with coupled measuring axes will be chosen. The choice is further determined by the extent to which an interferometer unit may affect the measuring signals $S(X)$, $S(\phi_2)$ and $S(Z)$. The interferometer error is the error caused by the interferometer itself in the detector signals $S_{213}$, $S_{215}$ and $S_{227}$. When such an error $\Delta$ occurs in each detector signal, the error in the measuring signals, in the case of three independent measuring axes, is:

$$\Delta S(X) = \frac{\Delta + \Delta + \Delta}{3} = \Delta \quad (23)$$

$$\Delta S(\varphi_2) = \frac{\Delta + \Delta}{g} = \frac{2\Delta}{g} \quad (24)$$

$$\Delta S(Z) = \frac{\frac{\Delta + \Delta}{2} + \Delta}{h} = \frac{3\Delta}{h} \quad (25)$$

and in the case of three coupled measuring axes:

$$\Delta S(X) = \Delta + \frac{\Delta + \Delta}{3} = \frac{5\Delta}{3} \quad (26)$$

$$\Delta S(\varphi_2) = \frac{\Delta}{g} \quad (27)$$

$$\Delta S(Z) = \frac{\Delta}{h} \quad (28)$$

$$\Delta S(\phi_2)=\Delta/g \quad (27)$$

$$\Delta S(Z)=\Delta/h \quad (28)$$

As described in EP-A 0 498 499, the interferometer unit 100 may be provided with an extra X measuring axis. A signal representing the tilt $\phi_{ij}$ of the substrate about the Y axis may be obtained from the information of this measuring axis, MAX,3 in combination with the information supplied by the MAX,1 measuring axis. In FIG. 14, the references $P_{x,9}$ and $P_{x,10}$ indicate the points where the measuring beam associated with the MAX,3 measuring axis successively impinges upon the X measuring mirror $R_1$, if this measuring beam is passed twice to the mirror $R_1$ via a retroreflector.

The measuring beam for the MAX,3 measuring axis may be supplied by a separate radiation source. However, this measuring beam may be alternatively obtained in a way analogous to that described with reference to FIGS. 10, 12, and 13 for obtaining the Z measuring beam. The path of the measuring beam $b'_{20,m}$ passed by the measuring mirror $R_1$ and the prism system 208 then incorporates a reflector system which is analogous to the system 220. This system reflects the measuring beam and the associated reference beam to the measuring mirror $R_1$ and ensures that the beams will extend in an XY plane different from that in FIG. 10. In this XY plane, the beams traverse paths which are analogous to those shown in FIG. 12 for the Z measuring beam and the associated reference beam. However, the XY plane in which the measuring beam of the measuring axis MAX,3 extends is now located behind instead of in front of the plane of the drawing. The interferometer unit includes a separate detector for the MAX,3 measuring axis.

For the way in which a signal can be obtained by means of the MAX,3 measuring axis, reference is made to EP-A 0 489 499 in which an interferometer unit with three X measuring axes is described. To implement the invention in such a unit, a neutral beam splitter may be arranged between the prism system 208 and the reflector system 220, and a reflector system as shown in FIG. 13 may be placed in the radiation path of each measuring beam formed by this beam splitter.

To measure the displacement of the substrate holder in the Y direction and a possible tilt of the holder about the X axis, the composite interferometer system includes a second interferometer unit which is denoted by 150 in FIG. 4. In principle, this interferometer unit has two measuring axes MAX,4 and MAX,5. For a description of the construction and the operation of this interferometer unit, which is constructed in accordance with the same principle as the interferometer unit 100, reference is made to EP-A 0 489 499. Instead of, or similarly as, the interferometer unit 100, this interferometer unit may also be extended with a Z measuring axis and an associated detector in the same way as described with reference to FIGS. 10, 11, 12, 13, and 15.

In the interferometer units 100 and 150, it is not necessary for the detectors 213, 215 and 227 in the unit 100 to be arranged directly behind the analyzers 212, 214 and 226 in the unit 100 but, if desired, these detectors may be arranged at larger distances and possibly close together. Optical fibers can then be used to guide the beams to the detectors. Lenses for focusing the beams on the entrance planes of the fibers may be arranged between the analyzers and the fibers.

The prism retroreflectors, or three-dimensional "corner cubes", as shown in FIGS. 10, 12, and 15, may also be replaced by cat's eye retroreflectors. Such a retroreflector is constituted by a lens with a mirror arranged in its focal plane, and it ensures that not only the principal axis of the reflected beam is parallel to that of the incoming beam, but it also ensures that these principal axes coincide.

In view of the required accuracy of the composite interferometer system, changes of ambient parameters, such as temperature, air pressure, humidity may start playing a role. These changes cause a variation of the refractive index of the medium in which the interferometer beams propagate. Such a variation may also be caused by turbulences in the medium. To be able to determine these variations, so that they can be corrected, EP-A 0 498 499 proposes to provide the interferometer system described therein with an extra, for example sixth, measuring axis which is used as a reference axis along which a beam extends which co-operates with a stationary reference reflector. In FIG. 4, this reflector is denoted by the reference numeral 170 and the measuring beam of the reference measuring axis is denoted by $b_{50,m}$. This beam is preferably supplied by the interferometer unit which has the smallest number of measuring axes, i.e., unit 150 in the embodiments described, and the beam coming from this unit is sent to the reflector 170 by a reflector 171. The interferometer unit then includes an extra detector for receiving the beam $b_{50,m}$ reflected by the reference reflector and the associated reference beam and for converting them into an electric signal.

The measuring beam $b_{50,m}$ traverses a constant geometrical path length. The optical path length, which is the product of the geometrical path length and the refractive index of the traversed medium, is, however, influenced by a variation of the refractive index. This variation thus also influences the path length difference between the measuring beam $b_{50,m}$ and the associated reference beam. The variation of the path length difference is measured by means of said extra detector and its output signal can be used to correct the information obtained via other measuring axes for refractive index variations due to turbulences or variations of the ambient parameters.

As is shown in FIG. 4, the reference reflector 170 is connected to the interferometer unit 150 via a plate 190, preferably of a very stable material such as "Zerodure" or "Invar". A very stable construction for the reference measuring axis is then obtained.

The information of the reference measuring axis may also be used for correcting the measuring information from other optical measuring systems, such as a focus error detection system and/or a focus-and-level detection system if the beams of these measuring systems traverse the same space as the interferometer beams.

For measuring the refractive index variations, it is sufficient to use one measuring beam. However, if desired, a double measuring beam and a double reference beam may also be realized for the reference measuring axis, in the way as has been described in the foregoing for the other measuring axes.

Refractive index variations may also be measured by means of two measuring beams which have considerably different wavelengths, for example, different by a factor of two, and traverse the same path within the medium in which the interferometer beams propagate. Since the refractive index for a beam is dependent on the wavelength of this beam, the optical path lengths for these beams are different despite the equal geometrical path lengths for the beams, so that these beams have a phase difference upon arrival at a detector. In the case of refractive index variations, there are also variations of this phase difference, so that a signal which is indicative of the refractive index variation is obtained. This measurement of the refractive index variation, which is known per se and described in, for example U.S. Pat. No. 5,404,222, can be performed along the reference measuring axis denoted by $b_{50,m}$ in FIG. 4, but also along any of the above-mentioned measuring axes, including the Z measuring axis.

An even greater accuracy of the composite interferometer system can be obtained if it is ensured that the same circumstances prevail in the entire space in which the interferometer beams propagate. This can be realized by passing a constant, preferably laminar stream of conditioned air through this space. An embodiment of the air shower referred to here is described in EP-A 0 489 499 to which reference is made for constructive data.

The invention may not only be used in the above-described embodiments of a five or six-axis interferometer system, but also in other embodiments of such an interferometer system, some of which are described in EP-A 0 489 499 and to which reference is made for details about their construction. In addition to a five or six-axis interferometer system, the invention may also be used in interferometer systems having a smaller number of measuring axes, for example, in a three-axis interferometer system with two interferometer units, an embodiment of which is shown in FIG. 2.

In a step-and-scan photolithographic apparatus, the mask holder should also be moved with great accuracy. To check this movement, a multi-axis interferometer system may be used. Also this interferometer system may be a system in accordance with the present invention, hence an interferometer system with at least one Z measuring axis so that very accurate and reliable measuring results can be achieved.

To ensure that the mask and the substrate are positioned with respect to each other in an extremely accurate manner during illumination of the IC areas, in a lithographic apparatus having a high throughput feed-through rate for the substrates it should be prevented that forces of the actuators for the substrate holder and the mask holder are transferred to components of the interferometer system for the substrate holder and, in the case of a step-and-scanner, to the interferometer system for the mask holder. To this end, the components of the interferometer system(s), with the exception of the measuring mirrors, may be arranged in a rigid frame in which also the projection system is rigidly secured, which frame is suspended dynamically isolated from the other components of the apparatus. The interferometer components are now rigidly coupled free from disturbance to the projection system. Since said frame, also referred to as metrology frame, is suspended dynamically isolated or free from vibrations in the apparatus, the positions of the interferometer components present therein are no longer affected by external forces such as the drive forces for the substrate table and the mask table.

Figure 16:
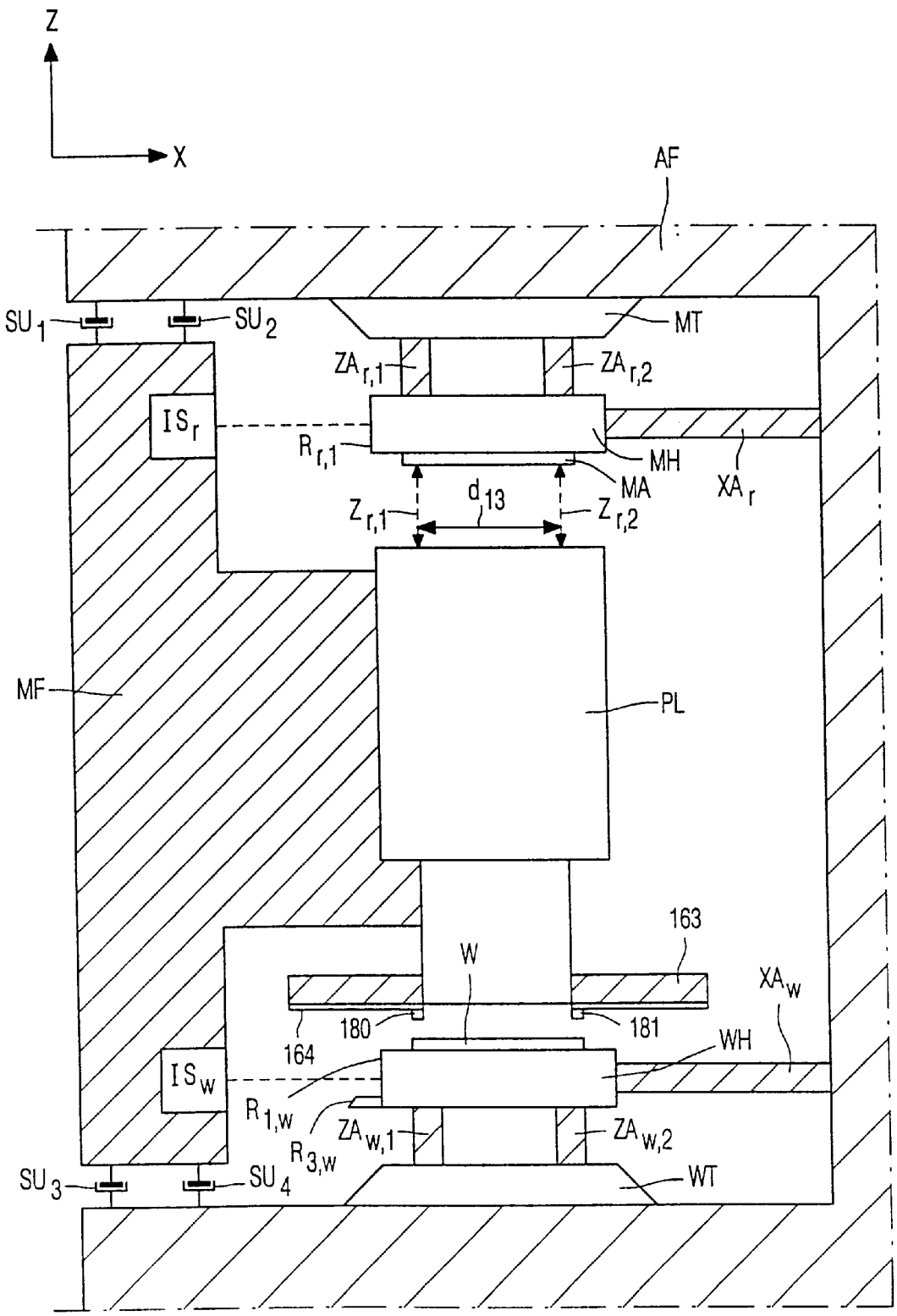
FIG. 16 shows a lithographic apparatus with a metrology frame and an actuator frame.

FIG. 16 shows diagrammatically a step-and-scanning optical lithographic apparatus provided with a metrology frame. Such an apparatus not only comprises an interferometer system ISW for the substrate, but also an interferometer system ISM for measuring the X and Y displacements of the mask. Since these interferometer systems and the projection system PL are arranged in a metrology frame MF, these systems are rigidly fixed with respect to each other, and the image of the mask pattern formed by the projection system is coupled to the interferometer systems.

If the apparatus is provided with a focus error detection system, as mentioned in the opening paragraph, and with capacitive or other sensors for measuring the height of the mask, these detection systems are also incorporated in the metrology frame. Since the measuring mirrors $R_{1,w}$ and $R_{3,w}$ of the substrate interferometer system and the measuring mirror $R_{1,r}$ of the mask interferometer system are part of the substrate holder WH and the mask holder MH, respectively, on which the substrate and the mask are rigidly fixed, the movements of the substrate and the mask are directly measured with these systems. Consequently, these movements and the mask pattern image formed are not affected by movements of other components of the apparatus, such as actuators for adjusting the mutual position of the substrate and the mask along the Z axis.

The actuators for displacing the mask and the substrate in the X and Y directions, of which only the X actuators $XA_w$ and $XA_r$ are illustrated by way of rods in FIG. 16, form part of an actuator frame AF.

The metrology frame is suspended in the actuator frame by means of diagrammatically shown dynamic isolators $SU_1$, $SU_2$, $SU_3$ and $SU_4$ so that this frame is dynamically decoupled from the rest of the apparatus. The mask table MT and the substrate table WT are arranged in the actuator frame. The substrate table has three Z actuators, two of which, $ZA_{w,1}$ and $ZA_{w,2}$ are shown, with which the Z position of the substrate can be adjusted by equal energization of the three actuators, or with which a tilt of the substrate can be realized by unequal energization of the three actuators. These movements can be realized also for the mask in an analogous manner if the mask table is also provided with three Z actuators, two of which, $ZA_{r,1}$ and $ZA_{r,2}$, are shown.

The vertical position of the substrate with respect to the projection lens system can be measured in accordance with the invention with the composite substrate interferometer system ISW which is provided with a Z measuring axis. In addition, the apparatus may be provided with a focus error detection system as illustrated by elements 40–46 in FIG. 1. With the information supplied by the Z measuring axis of the system ISW and the focus error detection system, the Z actuators in the substrate table can be controlled in such a way that the substrate is adjusted at the correct height, or Z position.

Furthermore, a plate 163 is provided which is rigidly secured to the lower part of the projection lens holder. As already described, the reflecting lower side 164 of this plate constitutes the Z reflector for the Z measuring axis of the interferometer system ISW. Elements of the focus error detection system or of a focus-and-level detection system may be arranged in or on this plate.

The construction shown in FIG. 16 with a metrology frame and an actuator frame may also be used in a lithographic apparatus of the stepping type in which a Z measurement is performed in accordance with the invention. Such an apparatus does not comprise a mask interferometer system.

Strict requirements with respect to rigidity and stability must be imposed on the metrology frame, and the material of this frame must have a very small temperature coefficient of expansion. However, these requirements may be alleviated if the reference mirrors for the X and Y measuring axes of the substrate interferometer system and possibly of the mask interferometer system are secured to the holder of the projection lens system PL or on the metrology plate 163. The interferometer systems and the projection lens system are then optically coupled and mutual movements can no longer affect the measurements. This facility is diagrammatically shown in FIG. 16 with the two reference mirrors 180 and 181 under the plate 163. The reference beams may be guided from the substrate interferometer system to these reference mirror via reflectors. Also for the mask interferometer system, the reference mirrors may be secured to the holder of the projection lens system.

It is to be noted explicitly that, also in a lithographic projection apparatus without a metrology frame, the X and Y reference mirrors of the substrate interferometer system, and possibly of the mask interferometer system, may be secured to the holder of the projection lens system so as to obtain the same advantages. A photolithographic projection apparatus provided with multi-axis interferometer systems in which the reference mirrors are secured to the holder of the projection lens system is known per se and described in PCT WO 97/33205.

As already noted in the opening paragraph, the invention can be used to great advantage, particularly in a lithographic apparatus which is provided with two or more substrate tables which are moved between the illumination system, shown in FIGS. 1 and 16, where the mask and the projection system are present, and one or more separate alignment stations where a substrate is aligned with respect to a substrate table. Since the substrate holders are moved through relatively large distances in such an apparatus, it is no longer sufficient to use a focus error detection system or a focus-and-level detection system, and a separate measurement of the Z position of the substrate is required.

Figure 17:
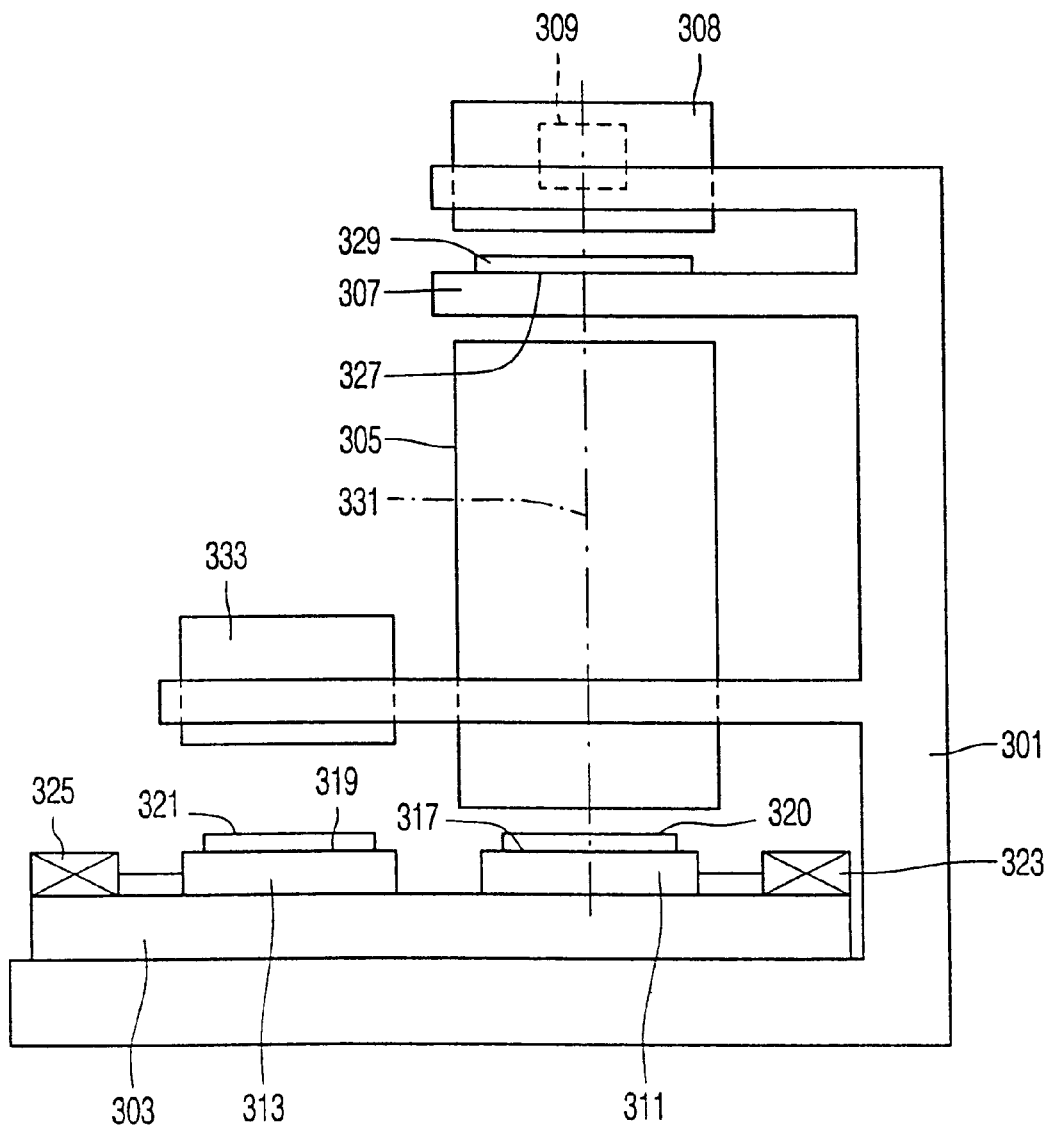
FIG. 17 shows a lithographic apparatus with two substrate holders and one separate aligmnent station.

FIG. 17 shows diagrammatically the mechanical elements of an apparatus with two substrate holders. This apparatus comprises a frame 301 which, viewed in a vertical Z direction, successively comprises a positioning device 303, a mask holder 307 and an illumination unit 308 provided with a radiation source 309. The positioning device 303 comprises a first substrate holder 311 and a second, identical substrate holder 313. A projection lens holder 305 is present between the mask holder and the substrate holder. The substrate holders 311 and 313 comprise a first and a second supporting face 317 and 319 which extend perpendicularly to the Z direction and on which a first substrate 320 and a second substrate 321, respectively, may be arranged. The first and second substrate holders 311 and 313 are movable with respect to the frame 301 in a first direction, parallel to an X direction which is perpendicular to the Z direction, and in a second direction parallel to an Y direction which is perpendicular to the Z direction and the X direction, by means of a first displacement unit 323 and a second displacement unit 325, respectively, of the positioning device 303. The mask holder 307 has a supporting surface 327 which extends perpendicularly to the Z direction and on which a mask 329 can be arranged.

The substrates which must be illuminated are arranged in a magazine which is entered into the apparatus. From this magazine, the substrates are consecutively introduced into an alignment station by means of a transport mechanism. Said magazine and transport mechanism, which are not shown in FIG. 17, are known per se. The alignment station is diagrammatically represented in FIG. 17 by a measuring unit 333 which is also secured to the frame 301. In the situation of the apparatus shown in FIG. 17, the first substrate holder 311 is present in the illumination station and the first substrate 320 is illuminated via the mask 329 with radiation emitted by the illumination unit 308 and is focused by the projection system which is present in the holder 305. Only the optical axis 331 of this projection system is shown. The second substrate holder 313 is present in the alignment station. In this station, the position of one or more alignment marks for the second substrate 321 provided on the substrate holder is determined with respect to one or more corresponding alignment marks on the substrate holder by the unit 333, and this position is corrected with the aid of mechanical means (not shown). After the illumination of the substrate 319 is finished, the first substrate holder 311 is displaced by the positioning device from the illumination station to the alignment station. From this station, the first substrate 320 is moved by said transport mechanism to said magazine. Simultaneously, the second substrate holder is moved from the alignment station to the illumination system by the positioning device 303. Since the second substrate 321 in the alignment station is already positioned correctly with respect to the second substrate holder, only the position of one or more alignment marks of the substrate holder is to be measured and corrected with respect to corresponding marks in the mask in the illumination station. This measurement and correction is a relatively simple process which can be performed quickly. Since the more difficult and more time-consuming alignment of the second substrate with respect to the substrate holder is performed in the alignment station and time-parallel with the illumination of the first substrate, the illumination station can be used for the illumination itself for a maximum period of time so that a large number of substrates can be illuminated per unit of time.

The principle and advantages of a photolithographic apparatus with two substrate tables are described in, inter alia, EP-A 0 687 957 and in the English-language abstract of JP-A 57-183031 in which also embodiments of such an apparatus are shown.

Figure 18:
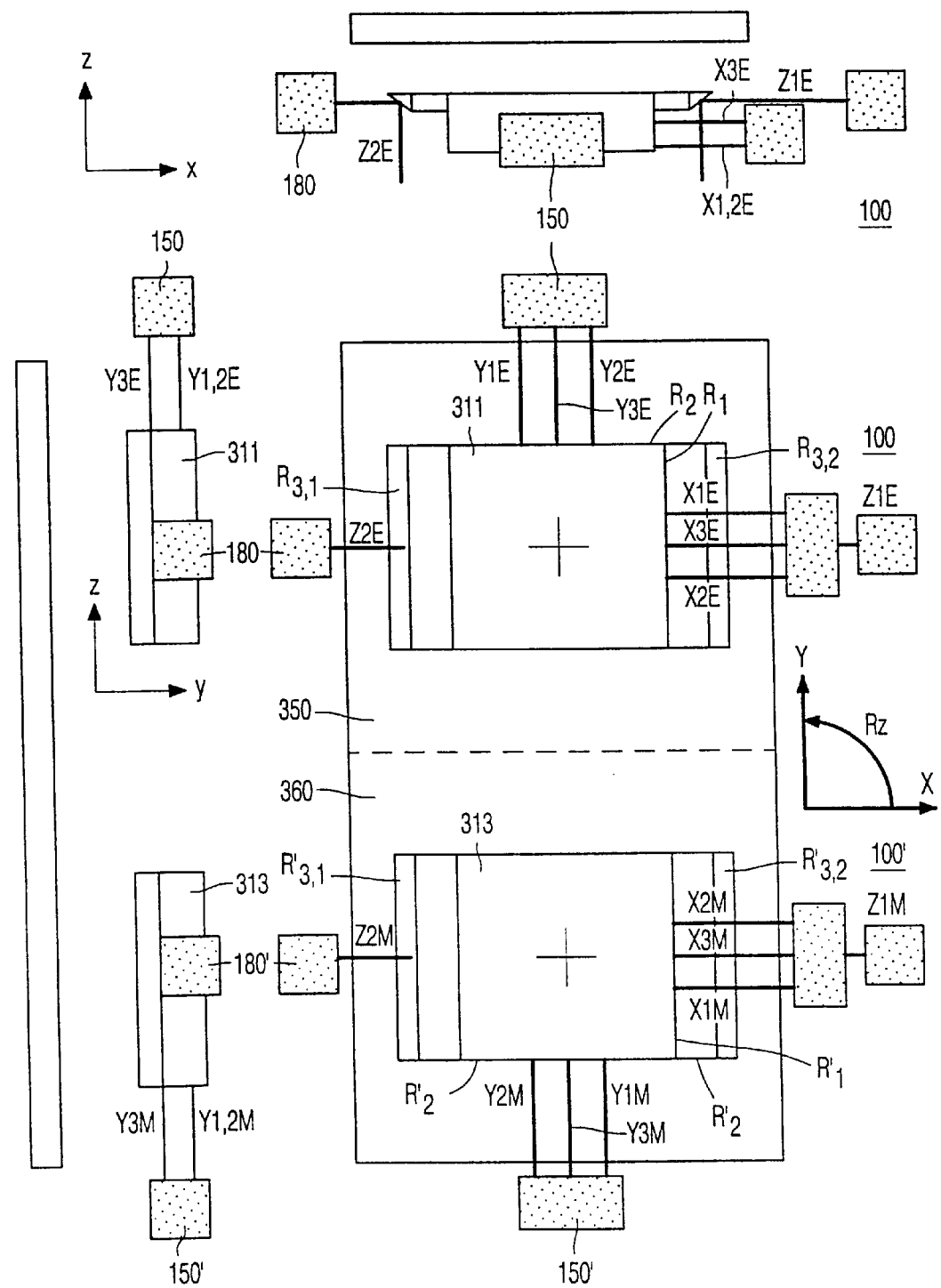
FIG. 18 is a survey of the interferometer measurements which are performed on a substrate in the alignment station and in the illumination station of this apparatus.

As has been noted hereinbefore, the positions of the alignment marks are fixed during alignment of the substrate in a system of co-ordinates defined by the interferometer system. In a lithographic apparatus which, in addition to an illumination station comprises an alignment station, both stations should then be provided with an interferometer system. FIG. 18 is an overview of the interferometer measurements which are performed in a given embodiment of the apparatus on the substrate in the illumination station and the alignment station. This Figure shows the two substrate holders 311 and 313 with the X measuring mirrors $R_1$, $R'_1$, Y measuring mirrors $R_2$ and $R'_2$ and Z measuring mirrors $R_{3,1}$, $R_{3,2}$, $R'_{3,1}$, $R'_{3,2}$. The central part of FIG. 18 is a cross-section taken on the XY plane, the upper part is a cross-section taken on the XZ plane, and the left-hand part is a cross-section taken on the YZ plane. The reference numerals 350 and 360 denote the measuring area of the illumination station and that of the alignment station. Each measuring axis is indicated by two letters and one numeral. The first letter indicates the direction (X, Y or Z) in which the measurement is performed with the relevant measuring axis, the numeral shows the number of the measuring axis in this direction, and the second letter indicates whether the measurement takes place in the alignment station (M) or the illumination station (E). In the embodiment of FIG. 18, the measurements are performed along three measuring axes both in the X direction and in the Y direction, and two Z measurements are performed. The same measurements are performed in both stations. However, it is alternatively possible to perform a different number and different types of measurements in the two stations. The number and types of measurements performed in each station depend on the desired accuracy and the desired position information.

Figure 19:
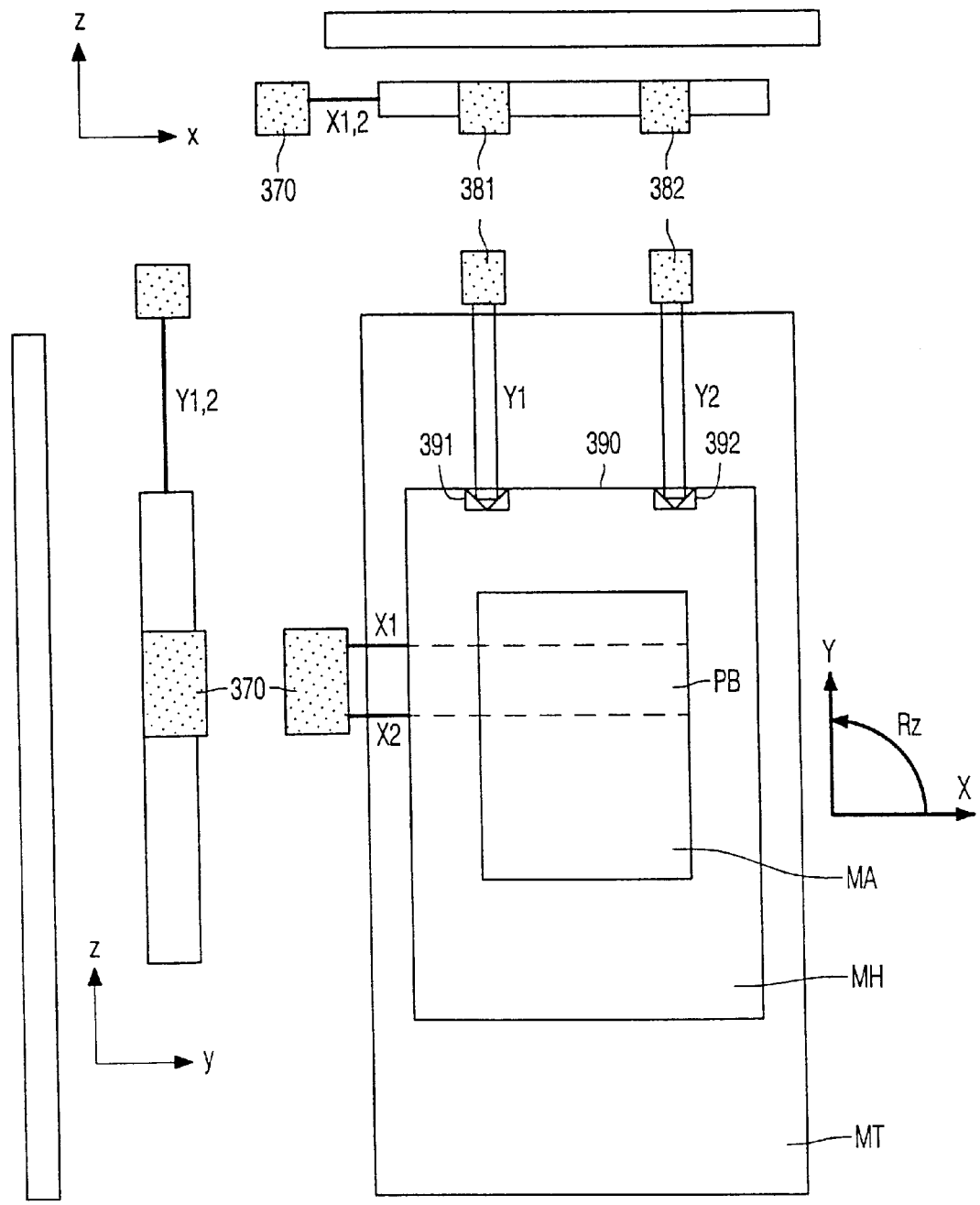
FIG. 19 shows the interferometer measurements which are performed on a mask in a step-and-scanner.

In the case of a step-and-scanning lithographic apparatus in which the mask is moved synchronously with the substrate, taking the magnification with which the mask is imaged into account, the displacements of the mask should also be measured accurately so as to compare them with the displacements of the substrate. For the sake of completeness, FIG. 19 is an overview of the interferometer measurements which are performed on the mask in the illumination station. FIG. 19 shows three different cross-sections, analogously as in FIG. 18. The mask is again denoted by MA, the mask holder is denoted by MH and the mask table is denoted by MT. The reference PB denotes the rectangular cross-section of the illumination beam at the area of the mask. This beam is moved in the Y direction with respect to the mask and the substrate during illumination of an IC area. An interferometer unit 370 comprises two X measuring axes $X_1$, $X_2$ so that not only the X position but also the rotation about the Z axis of the mask can be measured. The interferometer system comprises two Y measuring axes $Y_1$, $Y_2$ which, as shown in FIG. 19, may be associated with two separate interferometer units 381, 382, or may be associated with one interferometer unit. Not only the Y position but also the rotation about the Z axis can be measured with these two measuring axes. Since the mask only needs to make a short movement in the X direction, it is not necessary to arrange a reflector throughout the side face 390 of the mask holder and it is sufficient to use two small reflectors 391, 392 at the area of the measuring axes. As is shown in FIG. 19, these reflectors are preferably corner cube reflectors.

Figure 20:
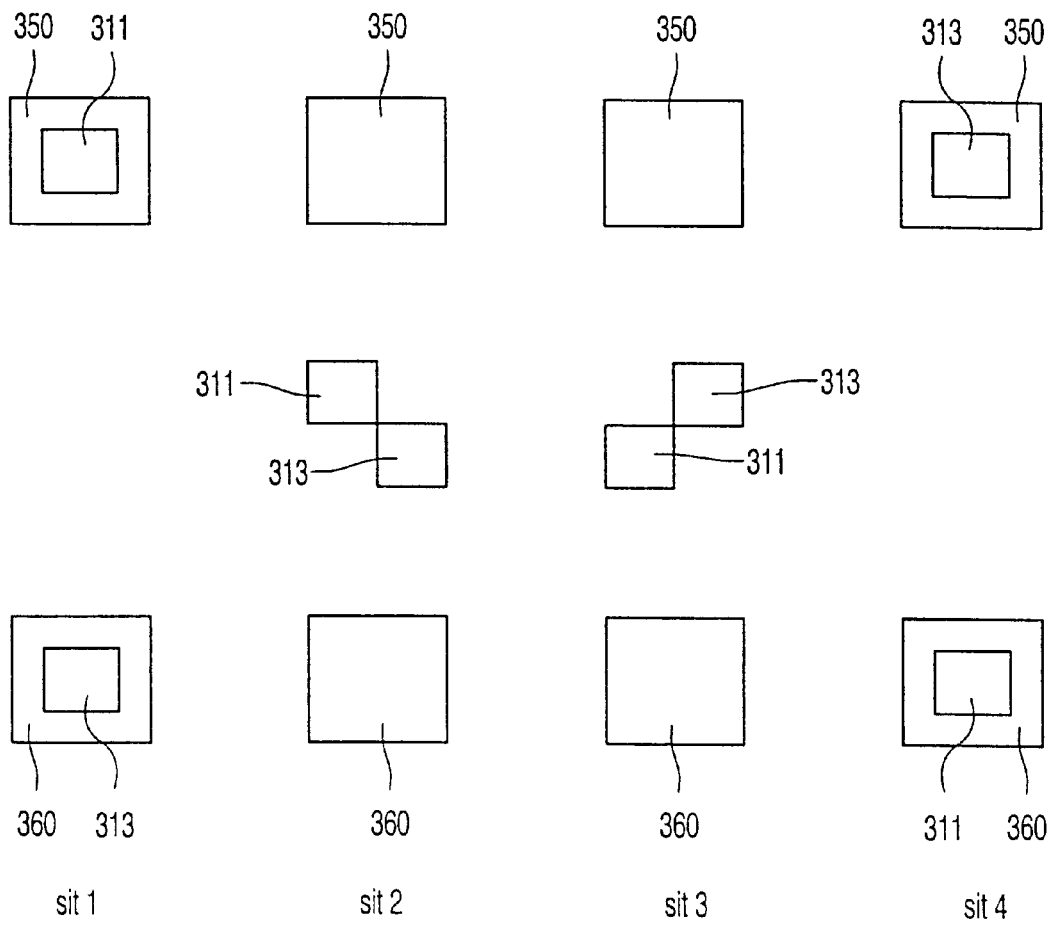
FIG. 20 shows the movements performed by the two substrate holders in the apparatus of FIG. 17.

In order that the two substrate tables and associated substrate holders in a lithographic apparatus, in which the present invention can be used to great advantage, are moved from the alignment station to the illumination station, and vice versa, the two substrate tables may be secured to a common rotatable arm during this movement so that the substrates can be brought to the first station or the second station via a common rotation. However, for performing these movements, the substrate tables are preferably driven separately in such a way that they make rectilinear movements in the XY plane. FIG. 20 shows how the substrate holders 311 and 313 and the associated tables (not shown) move with respect to the illumination station 350 and the alignment station 360 in that case. In this Figure, four different situations are denoted by SIT 1–SIT 4 from left to right. In SIT 1, the substrate holder 311 is present in the illumination station and the substrate present on this holder is illuminated, while the substrate holder 313 is present in the alignment station and the substrate in this holder is aligned with respect to the substrate holder. In SIT 2, the illumination process and the alignment process have been completed, and the two substrate holders have left the relevant station. In SIT 3, the two substrate holders have passed each other, and substrate holder 311 is on its way to the alignment station 360 and substrate holder 313 is on its way to the illumination station 350. In SIT 4, substrate holder 313 is positioned in the illumination station so that the substrate present on this holder can be illuminated, while the substrate holder 311, after removal of its substrate and provided with a new substrate, is positioned in the alignment station so that the new substrate can be aligned with respect to the holder.

The novel interferometer system has been described hereinbefore with reference to its use in a photolithographic reduction apparatus for manufacturing IC structures. However, the invention may also be used in photolithographic apparatuses for manufacturing other structures such as structures for integrated optical systems, and guidance and detection patterns of magnetic domain memories, or structures of liquid crystalline display panels. The problems for which the invention provides a solution may also occur in other lithographic apparatus in which radiation, other than optical radiation such as ion radiation, electron radiation, or X-ray radiation, is used for imaging a mask pattern, either with or without reduction, so that the invention can also be used in these lithographic apparatus. The image may be a projection image or a proximity image. The invention may also be used in apparatus other than lithographic ones such as an apparatus for very accurate X, Y and Z position measurements used, for example, for inspecting masks.

What is claimed is:

1. An interferometer system for measuring position and displacement of an object in a plane parallel to the XY plane of an XYZ system of co-ordinates using X and Y measuring mirrors which are arranged on a holder for said object, said system comprising:

a means for generating a plurality of measuring beams and for directing said measuring beams along a plurality of measuring axes which are parallel to the XY plane and extend to and from said measuring mirrors; and a plurality of radiation-sensitive detectors which convert measuring beams reflected by said measuring mirrors into electric measuring signals, wherein a number of X and Y measuring axes is at least equal to a number of object movements to be measured interferometrically, wherein said system is adapted to measure a Z position of said object using a Z measuring mirror arranged on said holder of said object at an acute angle to the XY plane, and the interferometer system includes a Z measuring axis and a means for generating a Z measuring beam and for directing said Z measuring beam onto said Z measuring mirror, and a Z detector which converts said Z measuring beam from said Z measuring mirror into a signal containing information about said Z position of said object.

2. The interferometer system as claimed in claim 1, wherein said Z measuring mirror is arranged on said holder of said object at an angle of substantially 45° to the XY plane.

3. The interferometer system as claimed in claim 1, wherein said Z measuring mirror is formed by a beveled portion of an X or Y measuring mirror.

4. The interferometer system as claimed in claim 1, wherein said Z measuring mirror is formed by a beveled bar arranged on a side face of said object holder on which an X or Y measuring mirror is arranged, said bar extending in said Z direction through only a small portion of said side face and, in the direction perpendicular thereto, throughout said side face.

5. The interferometer system as claimed in claim 4, wherein said Z measuring mirror is arranged on a part of said object holder remote from said object.

6. The interferometer system as claimed in claim 3, wherein a reference mirror for a reference beam associated with said Z measuring beam is formed by an X or Y measuring mirror which is arranged on said side face of said object holder on which said Z measuring mirror is arranged.

7. The interferometer system as claimed in claim 1, wherein a path of said Z measuring beam incorporates a retroreflector by which said Z measuring beam reflected by said measuring mirror and directed towards said detector is reflected to said Z measuring mirror for further reflection on said mirror.

8. The interferometer system as claimed in claim 1, wherein, in addition to said Z measuring axis, said system includes at least five further measuring axes.

9. The interferometer system as claimed in claim 1, wherein said system includes a measuring axis along which two measuring beams of different wavelengths propagate.

10. A projection apparatus for repetitively projecting a mask pattern onto a substrate, said apparatus comprising:

an illumination unit for supplying a projection beam;

a mask table with a mask holder;

a substrate table with a substrate holder;

a projection system arranged in a path of said projection beam; and an optical measuring system for measuring positions and orientations of said substrate, said optical measuring system being an interferometer system for measuring position and displacement of an object in a plane parallel to the XY plane of an XYZ system of co-ordinates using X and Y measuring mirrors which are arranged on a holder for said object, said interferometer system comprising:

a means for generating a plurality of measuring beams and for directing said measuring beams along a plurality of measuring axes which are parallel to the XY plane and extend to and from said measuring mirrors; and a plurality of radiation-sensitive detectors which convert measuring beams reflected by said measuring mirrors into electric measuring signals, wherein a number of X and Y measuring axes is at least equal to a number of object movements to be measured interferometrically, wherein said interferometer system is adapted to measure a Z position of said object by a Z measuring mirror arranged on said holder of said object at an acute angle to the XY plane, and the interferometer system includes a Z measuring axis and a means for generating a Z measuring beam and for directing said Z measuring beam onto said Z measuring mirror, and a Z detector which converts said Z measuring beam from said Z measuring mirror into a signal containing information about said Z position of said object, and wherein said object and said object holder are said substrate and said substrate holder, respectively.

11. The projection apparatus as claimed in claim 10, wherein, except for said measuring mirrors, components of said interferometer system and said Z reflector are arranged in a rigid frame which also secures said projection system, said frame being suspended dynamically isolated from other components of said projection apparatus.

12. The projection apparatus as claimed in claim 10, wherein said reference mirrors for reference beams associated with X and Y measuring beams are arranged on said holder of said projection system.

13. The projection apparatus as claimed in claim 10, wherein said object and said object holder are said mask and said mask holder, respectively.

14. The interferometer system as claimed in claim 2, wherein said Z measuring mirror is formed by a beveled portion of an X or Y measuring mirror.

15. The interferometer system as claimed in claim 2, wherein said Z measuring mirror is formed by a beveled bar arranged on a side face of said object holder on which an X or Y measuring mirror is arranged, said bar extending in said Z direction through only a small portion of said side face and, in a direction perpendicular thereto, throughout said side face.

16. The interferometer system as claimed in claim 4, wherein a reference mirror for a reference beam associated with said Z measuring beam is formed by an X or Y measuring mirror which is arranged on said side face of said object holder on which said Z measuring mirror is arranged.

17. The interferometer system as claimed in claim 5, wherein a reference mirror for a reference beam associated with said Z measuring beam is formed by an X or Y measuring mirror which is arranged on said side face of said object holder on which said Z measuring mirror is arranged.

18. The interferometer system as claimed in claim 2, wherein a path of said Z measuring beam incorporates a retroreflector by which said Z measuring beam reflected by said measuring mirror and directed towards said detector is reflected to said Z measuring mirror for further reflection on said mirror.

19. The interferometer system as claimed in claim 2, wherein in addition to said Z measuring axis, said system includes at least five further measuring axes.

20. The interferometer system as claimed in claim 2, wherein said system includes a measuring axis along which two measuring beams of different wavelengths propagate.

21. An interferometer system for measuring position and displacement of an object in a plane parallel to the XY plane of an XYZ system of co-ordinates using X and Y measuring mirrors which are arranged on a holder for said object, said system comprising:
  a generator which generates a plurality of measuring beams and which directs said measuring beams along a plurality of measuring axes which are parallel to the XY plane and extend to and from said measuring mirrors; and
  a plurality of radiation-sensitive detectors which convert measuring beams reflected by said measuring mirrors into electric measuring signals, wherein a number of X and Y measuring axes is at least equal to a number of object movements to be measured interferometrically,
  wherein said system is adapted to measure a Z position of said object using a Z measuring mirror arranged on said holder of said object at an acute angle to the XY plane, and the interferometer system includes a Z measuring axis and a generator which generates a Z measuring beam and which directs said Z measuring beam onto said Z measuring mirror, and a Z detector which converts said Z measuring beam from said Z measuring mirror into a signal which comprises containing information about said Z position of said object.

22. The interferometer system as claimed in claim 21, wherein said Z measuring mirror is arranged on said holder of said object at an angle of substantially 45° to the XY plane.

23. The interferometer system as claimed in claim 21, wherein said Z measuring mirror is formed by a beveled portion of an X or Y measuring mirror.

24. The interferometer system as claimed in claim 21, wherein said Z measuring mirror is formed by a beveled bar arranged on a side face of said object holder on which an X or Y measuring mirror is arranged, said bar extending in said Z direction through only a small portion of said side face and, in the direction perpendicular thereto, throughout said side face.

25. The interferometer system as claimed in claim 24, wherein said Z measuring mirror is arranged on a part of said object holder remote from said object.

26. The interferometer system as claimed in claim 23, wherein a reference mirror for a reference beam associated with said Z measuring beam is formed by an X or Y measuring mirror which is arranged on said side face of said object holder on which said Z measuring mirror is arranged.

27. The interferometer system as claimed in claim 21, wherein a path of said Z measuring beam incorporates a retroreflector by which said Z measuring beam reflected by said measuring mirror and directed towards said detector is reflected to said Z measuring mirror for further reflection on said mirror.

28. The interferometer system as claimed in claim 21, wherein, in addition to said Z measuring axis, said system includes at least five further measuring axes.

29. The interferometer system as claimed in claim 21, wherein said system includes a measuring axis along which two measuring beams of different wavelengths propagate.

30. A projection apparatus for repetitively projecting a mask pattern onto a substrate, said apparatus comprising:
  an illumination unit for supplying a projection beam;
  a mask table with a mask holder;
  a substrate table with a substrate holder;
  a projection system arranged in a path of said projection beam; and
  an optical measuring system for measuring positions and orientations of said substrate, said optical measuring system being an interferometer system for measuring position and displacement of an object in a plane parallel to the XY plane of an XYZ system of co-ordinates using X and Y measuring mirrors which are arranged on a holder for said object, said interferometer system comprising:
    a generator which generates a plurality of measuring beams and which directs said measuring beams along a plurality of measuring axes which are parallel to the XY plane and extend to and from said measuring mirrors; and
    a plurality of radiation-sensitive detectors which convert measuring beams reflected by said measuring mirrors into electric measuring signals, wherein a number of X and Y measuring axes is at least equal to a number of object movements to be measured interferometrically,
    wherein said interferometer system is adapted to measure a Z position of said object by a Z measuring mirror arranged on said holder of said object at an acute angle to the XY plane, and the interferometer system includes a Z measuring axis and a generator which generates a Z measuring beam and which directs said Z measuring beam onto said Z measuring mirror, and a Z detector which converts said Z measuring beam from said Z measuring mirror into a signal which comprises containing information about said Z position of said object, and
  wherein said object and said object holder are said substrate and the substrate holder, respectively.

31. The projection apparatus as claimed in claim 30, wherein, except for said measuring mirrors, components of said interferometer system and said Z reflector are arranged in a rigid frame which also secures said projection system, said frame being suspended dynamically isolated from other components of said projection apparatus.

32. The projection apparatus as claimed in claim 30, wherein said reference mirrors for reference beams associated with X and Y measuring beams are arranged on said holder of said projection system.

33. The projection apparatus as claimed in claim 30, wherein said object and said object holder are said mask and said mask holder, respectively.

34. The interferometer system as claimed in claim 32, wherein said Z measuring mirror is formed by a beveled portion of an X or Y measuring mirror.

35. The interferometer system as claimed in claim 32, wherein said Z measuring mirror is formed by a beveled bar arranged on a side face of said object holder on which an X or Y measuring mirror is arranged, said bar extending in said Z direction through only a small portion of said side face and, in a direction perpendicular thereto, throughout said side face.

36. The interferometer system as claimed in claim 34, wherein a reference mirror for a reference beam associated with said Z measuring beam is formed by an X or Y measuring mirror which is arranged on said side face of said object holder on which said Z measuring mirror is arranged.

37. The interferometer system as claimed in claim 35, wherein a reference mirror for a reference beam associated with said Z measuring beam is formed by an X or Y measuring mirror which is arranged on said side face of said object holder on which said Z measuring mirror is arranged.

38. The interferometer system as claimed in claim 32, wherein a path of said Z measuring beam incorporates a retroreflector by which said Z measuring beam reflected by said measuring mirror and directed towards said detector is reflected to said Z measuring mirror for further reflection on said mirror.

39. The interferometer system as claimed in claim 32, wherein in addition to said Z measuring axis, said system includes at least five further measuring axes.

40. The interferometer system as claimed in claim 32, wherein said system includes a measuring axis along which two measuring beams of different wavelengths propagate.

\* \* \* \* \*